US010692724B2

(12) United States Patent
Smith et al.

(10) Patent No.: US 10,692,724 B2
(45) Date of Patent: Jun. 23, 2020

(54) ATOMIC LAYER ETCHING METHODS AND APPARATUS

(71) Applicant: Lam Research Corporation, Fremont, CA (US)

(72) Inventors: David Smith, Fremont, CA (US); Thorsten Lill, Fremont, CA (US); Andreas Fischer, Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 15/849,306

(22) Filed: Dec. 20, 2017

(65) Prior Publication Data
US 2018/0182634 A1   Jun. 28, 2018

Related U.S. Application Data

(60) Provisional application No. 62/438,978, filed on Dec. 23, 2016.

(51) Int. Cl.
*H01L 21/3065* (2006.01)
*H01L 21/311* (2006.01)
(Continued)

(52) U.S. Cl.
CPC .... *H01L 21/3065* (2013.01); *H01J 37/32422* (2013.01); *H01J 37/32899* (2013.01); *H01L 21/31122* (2013.01); *H01L 21/76814* (2013.01); *H01J 2237/334* (2013.01); *H01L 22/26* (2013.01)

(58) Field of Classification Search
CPC ........... H01L 21/3065; H01L 21/31122; H01L 21/76814; H01L 22/26; H01J 37/32422; H01J 37/32899; H01J 2237/334
See application file for complete search history.

(56) References Cited

U.S. PATENT DOCUMENTS 10,020,200 B1 *  7/2018  Monahan .............. C23C 16/047
2004/0026374 A1   2/2004  Nguyen et al.
(Continued)

FOREIGN PATENT DOCUMENTS

| KR | 101465338 B1 | 11/2014 |
| WO | 2016100873 A1 | 6/2016 |
| WO | 2016160778 A1 | 10/2016 |

OTHER PUBLICATIONS

PCT Notification of Transmittal of the Int'l. Search Report and the Written Opinion of the Int'l. Searching Authority from corresponding PCT Application No. PCT/US2017/068319, dated Apr. 23, 2018 (13 total pages).

*Primary Examiner* — Anita K Alanko
(74) *Attorney, Agent, or Firm* — Penilla IP, APC

(57) ABSTRACT

A method for performing atomic layer etching of a surface of a substrate is provided, including: performing a surface conversion operation by exposing the surface of the substrate to a surface conversion reactant; performing a ligand exchange operation by exposing the surface of the substrate to a ligand containing reactant; performing a desorption operation that effects removal of surface species from the surface of the substrate; performing a purge operation; repeating the surface conversion operation, the ligand exchange operation, the desorption operation, and the purge operation, for a predefined number of cycles.

16 Claims, 23 Drawing Sheets

(51) Int. Cl.
*H01J 37/32* (2006.01)
*H01L 21/768* (2006.01)
*H01L 21/66* (2006.01)

(56) References Cited

U.S. PATENT DOCUMENTS

| | | | |
|---|---|---|---|
| 2010/0068884 A1* | 3/2010 | Chen | H01L 21/31111 438/694 |
| 2015/0345029 A1 | 12/2015 | Wang et al. | |
| 2016/0293432 A1* | 10/2016 | Ranjan | H01J 37/32963 |
| 2017/0345665 A1* | 11/2017 | Faguet | H01L 21/31122 |

* cited by examiner

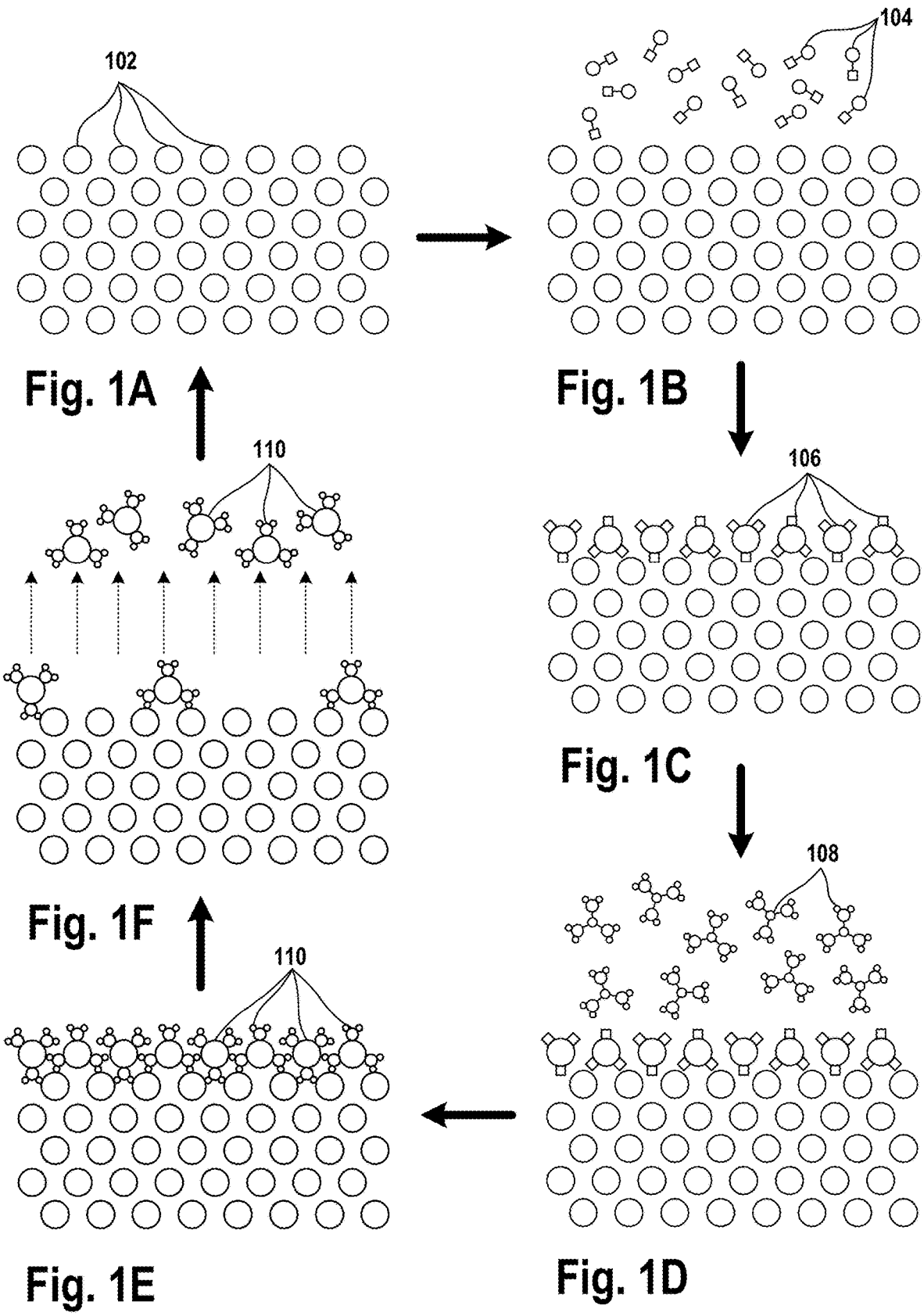

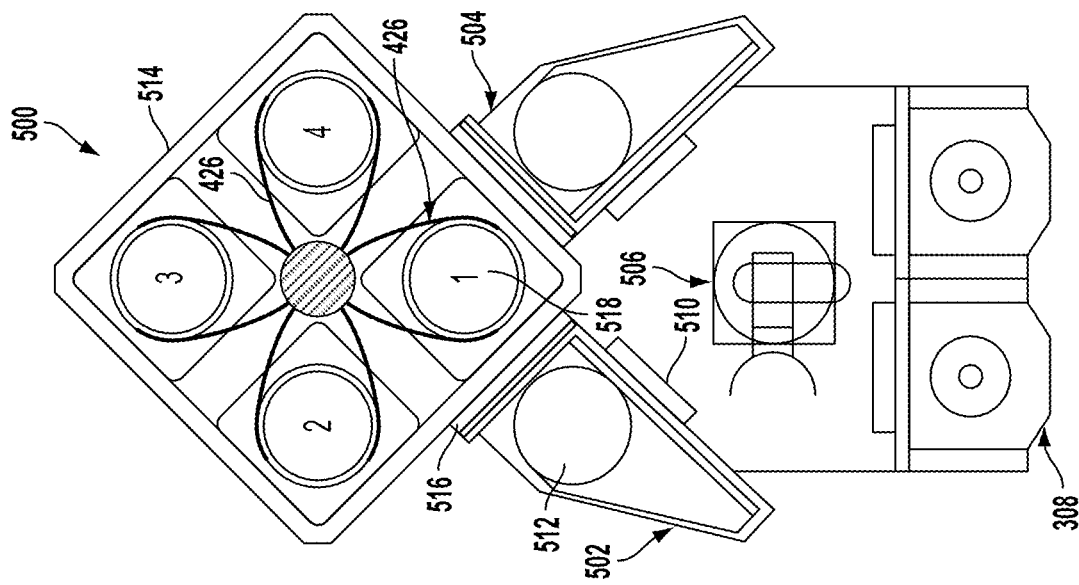
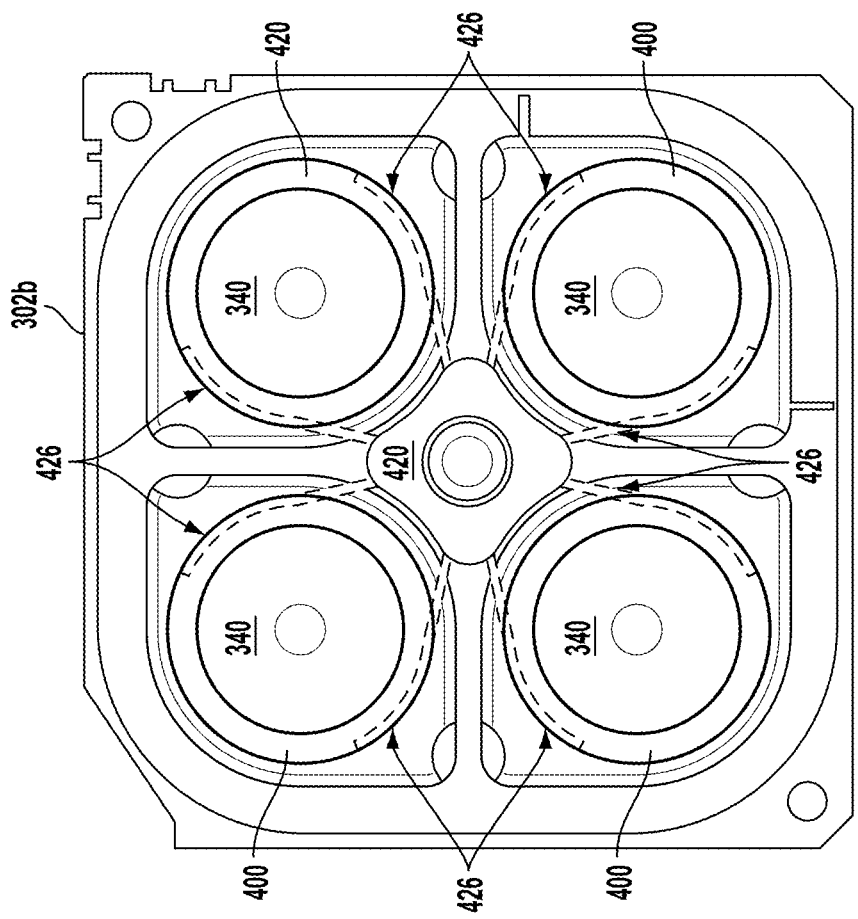
Fig. 5
Fig. 4

ATOMIC LAYER ETCHING METHODS AND APPARATUS

BACKGROUND

1. Field of the Disclosure

The present embodiments relate to semiconductor wafer processing, and more particularly, atomic layer etching (ALE) methods and apparatus.

2. Description of the Related Art

At present, the most extensively used etch process in the semiconductor industry is a dry plasma etch process known as reactive ion etching (RIE). In RIE, a partially ionized plasma discharge provides a mixture of reactive and nonreactive ions, electrons, reactive neutrals, passivating species, and photons, with the positively charged ions being accelerated normal to the substrate/wafer surface using a negative voltage bias on the substrate to produce an anisotropic etch. Plasma etching such as RIE is operated in a continuous fashion, with all reactions occurring simultaneously for the duration of the etch process. This can be beneficial in terms of providing fast etch rates, but also presents limitations in that process variability can be significant, with issues of wafer non-uniformity and surface composition/roughness requiring costly compensation measures.

As the semiconductor industry has moved towards smaller technology nodes in keeping with Moore's law, the industry is now entering the era of atomic-scale devices for the sub-10 nm technology node. Such devices will require atomic-scale fidelity, with acceptable feature size variability on the order of individual atoms expected in the coming years. The inherent process variability of current industry etch processes such as RIE renders them ill-suited for next-generation atomic-scale device manufacturing. Therefore, etch processes with atomic-scale control and minimal variability are sought to enable the sub-10 nm technology node.

It is in this context that embodiments of the disclosures arise.

SUMMARY

Embodiments of the present disclosure provide methods, apparatus, and systems to enable atomic layer etching.

In some implementations, a method for performing atomic layer etching of a surface of a substrate is provided, including: performing a surface conversion operation by exposing the surface of the substrate to a surface conversion reactant; performing a ligand exchange operation by exposing the surface of the substrate to a ligand containing reactant; performing a desorption operation that effects removal of surface species from the surface of the substrate; performing a purge operation; repeating the surface conversion operation, the ligand exchange operation, the desorption operation, and the purge operation, for a predefined number of cycles.

In some implementations, performing the desorption operation includes applying thermal energy to the substrate.

In some implementations, the applying thermal energy to the substrate is performed after performing the ligand exchange operation.

In some implementations, the applying thermal energy to the substrate is performed prior to and/or concurrently with the performing the ligand exchange operation.

In some implementations, the applying thermal energy to the substrate includes heating a pedestal on which the substrate is disposed and/or heating a process chamber in which the method is performed.

In some implementations, the applying thermal energy to the substrate includes activating a lamp to provide the thermal energy to the surface of the substrate.

In some implementations, performing the desorption operation includes exposing the surface of the substrate to a plasma.

In some implementations, the exposing the surface of the substrate to a plasma includes applying a bias voltage to the substrate.

In some implementations, performing the desorption operation includes exposing the surface of the substrate to a photon source to effect photolytic desorption.

In some implementations, wherein the surface conversion reactant adsorbs or chemisorbs on the surface of the substrate and modifies surface species on the surface of the substrate, wherein the surface conversion operation is substantially self-limiting; wherein the ligand containing reactant reacts with the modified surface species to form ligand-substituted species that are desorbed from the surface of the substrate.

In some implementations, a method for performing atomic layer etching of a surface of a substrate is provided, including: performing a surface conversion operation by moving the substrate into a surface conversion zone of a spatial processing tool, the surface conversion zone configured to expose the surface of the substrate to a surface conversion reactant; performing a ligand exchange operation by moving the substrate into a ligand exchange zone of the spatial processing tool, the ligand exchange zone configured to expose the surface of the substrate to a ligand containing reactant; performing a desorption operation by moving the substrate into a desorption zone of the spatial processing tool, the desorption zone configured to effect removal of surface species from the surface of the substrate; repeating the surface conversion operation, the ligand exchange operation, and the desorption operation, for a predefined number of cycles.

In some implementations, performing the desorption operation includes applying thermal energy to the substrate.

In some implementations, the applying thermal energy to the substrate includes activating a lamp to provide the thermal energy to the surface of the substrate.

In some implementations, performing the desorption operation includes exposing the surface of the substrate to a plasma.

In some implementations, performing the desorption operation includes exposing the surface of the substrate to a photon source to effect photolytic desorption.

In some implementations, the surface conversion reactant adsorbs or chemisorbs on the surface of the substrate and modifies surface species on the surface of the substrate, wherein the surface conversion operation is substantially self-limiting; wherein the ligand containing reactant reacts with the modified surface species to form ligand-substituted species that are desorbed from the surface of the substrate.

In some implementations, the method further includes: after performing the surface conversion operation, performing a first purge by moving the substrate through a first purge zone of the spatial processing tool; after performing the ligand exchange operation, performing a second purge by moving the substrate through a second purge zone of the spatial processing tool; after performing the desorption operation, performing a third purge by moving the substrate through a third purge zone of the spatial processing tool; wherein each of the predefined number of cycles further includes the first, second, and third purges.

Other implementations will be apparent upon consideration of the present disclosure.

BRIEF DESCRIPTION OF THE DRAWINGS

FIGS. 1A-1F conceptually illustrate an ALE process sequence, in accordance with implementations of the disclosure.

FIG. 4 illustrates a top view of a multi-station processing tool, wherein four processing stations are provided, in accordance with implementations of the disclosure.

FIG. 5 shows a schematic view of an embodiment of a multi-station processing tool 500 with an inbound load lock 502 and an outbound load lock 504, in accordance with implementations of the disclosure.

DESCRIPTION

Figure 2A:
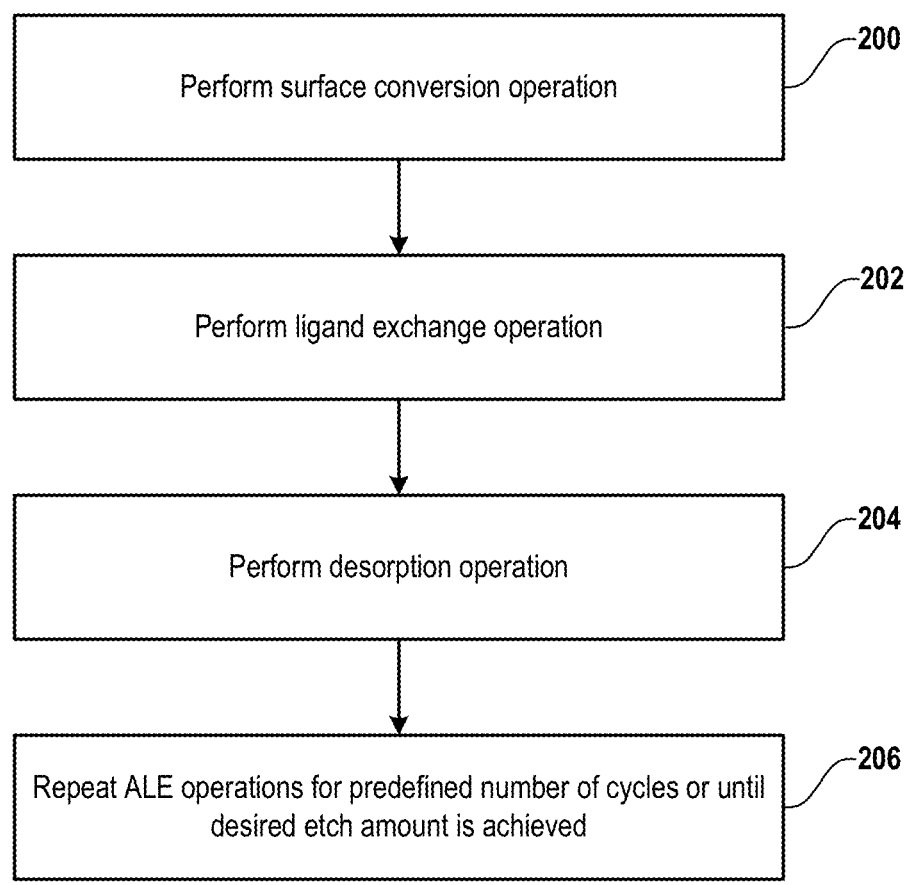
FIG. 2A broadly illustrates a method for performing atomic layer etching (ALE) of a substrate surface, in accordance with implementations of the disclosure.

Embodiments of the disclosure provide methods, apparatus, and systems for enabling atomic layer etching. It should be appreciated that the present embodiments can be implemented in numerous ways, such as a process, an apparatus, a system, a device, or a method. Several embodiments are described below.

Atomic later etching (ALE) is a technique that removes individual atomic-scale layers of material using a repeated sequence of self-limiting reactions. Because the reactions in an ALE process are self-limiting, the amount of etching is inherently more controllable with greater uniformity and consistency as compared to other etch techniques.

FIGS. 1A-1F conceptually illustrate an ALE process sequence, in accordance with implementations of the disclosure.

Shown at FIG. 1A is a portion of a surface 100 of a substrate in an unmodified state. The outermost layer 102 of molecules/atoms of the substrate surface 100 are exposed for the ALE process. As shown at FIG. 1B, a surface conversion/modification operation is performed to convert the surface layer of the substrate to a functionalized state. For example, the surface layer is modified by exposure to a surface conversion reactant 104, which may adsorb or chemisorb on the surface. The surface conversion reactant can include molecules or low energy radicals in various implementations, which react with the surface layer atoms to effect the surface conversion step. The resulting surface layer is shown at FIG. 1C consisting of a functionalized outermost layer 106 of molecules to enable subsequent ALE steps. As the reaction is self-limiting, only (or substantially only) the outermost layer of the substrate surface will undergo conversion. In some implementations, this surface modification entails conversion of the surface species to a halide. In some implementations, following the self-limiting surface conversion, the chamber is purged to remove any reaction byproducts or excess surface conversion reactant.

Following the surface conversion operation, then as illustrated at FIG. 1D, a ligand exchange reaction/operation is performed. In the illustrated implementation, the modified surface 106 of the substrate is exposed to a ligand containing reactant 108, which effects a ligand exchange reaction wherein the ligand containing reactant adsorbs on the substrate surface and transfers its ligands to the converted surface species 106 which were formed during the earlier surface modification/conversion operation. The ligands bond with the modified surface layer of molecules/atoms, forming a reaction product consisting of ligand substituted surface species 110 shown at FIG. 1E, which can be released as an individual molecule or as a larger combined molecule with the incoming molecule (dimer, trimer, or even larger clusters).

As shown at FIG. 1F, a desorption operation is performed to effect removal of the outermost layer of surface species 110 (the reaction product following the ligand exchange operation) from the substrate surface. In some implementations, the release can be achieved by the application of thermal energy, which can be applied simultaneous with the exposure to the ligand containing reactant or in a separate step. In some implementations, the reaction product itself may have a low enough vapor pressure such that it can be pumped out of the system without additional thermal adjustment. It will be appreciated that the removal process should ensure that there is no decomposition of the released molecules, which can be fairly large with multiple attached ligands, to avoid unwanted redeposition back on the wafer.

FIG. 2A broadly illustrates a method for performing atomic layer etching (ALE) of a substrate surface, in accordance with implementations of the disclosure. At method operation 200, the method initiates with performance of a surface conversion/modification operation. During the surface conversion operation, the outermost layer of surface molecules/atoms is modified by exposure to a surface conversion reactant, yielding a modified surface layer. The reaction is self-limiting so as to modify only the outermost atomic layer of the substrate. At method operation 202, a ligand exchange operation is performed. During the ligand exchange operation, the substrate is exposed to a ligand-containing reactant, which reacts with the modified surface layer so as to transfer its ligands to the surface layer molecules, e.g. by substituting for ligand species which were formed during the surface conversion operation.

During the ligand exchange operation, the outermost layer of the substrate is transformed into a ligand-containing surface species which can be released from the substrate surface in a desorption operation 204. In some implementations, the desorption operation 204 occurs simultaneously with the ligand exchange operation, as the ligand-containing surface species are released upon their formation. Whereas in other implementations, the desorption operation 204 is a separate operation performed after completion of the ligand exchange operation 202.

Furthermore, in some implementations, instead of a ligand exchange reaction (substitution reaction), a condensation or chelation reaction is utilized to transform the surface species and enable its removal from the substrate surface. As noted, the removal can be effected concurrently, or via another operation such as by applying thermal energy to the substrate.

The sequence of the surface conversion operation 200, the ligand exchange operation 202, and the desorption operation 204, define a single cycle of an atomic layer etch (ALE) process. At method operation 206, these ALE operations can be repeated for a predefined number of cycles, or until a desired etch amount is achieved. For example, in some implementations, in situ characterization mechanisms (e.g. ellipsometry) can be employed to enable in situ assessment of the etch process and determination of when to stop performance of ALE process cycles.

In the case of etching a metallic surface, the surface conversion operation is generally of the form:

$$M \rightarrow MX$$

where M is a metallic species present at the substrate surface and MX is a converted metallic species, X being representative of a ligand that is introduced through the surface conversion reaction. For example, where the surface metallic species is a metal nitride, the surface conversion operation may have the following form:

$$MN \rightarrow MX + NH_3$$

In another example, where the surface metallic species is a metal oxide, the surface conversion operation may have the following form:

$$MO \rightarrow MX + H_2O$$

In some implementations, X is a halide, such as fluorine, chlorine, bromine, or iodine.

Following the surface conversion operation, the ligand exchange operation may generally have the following form:

$$MX \text{ (adsorbed)} + M'L \rightarrow ML \text{ (adsorbed)} + M'X \text{ (adsorbed)}$$

where M'L is a ligand containing reactant having a metal M' and ligand L, ML is a ligand-substituted species (reaction product) after ligand exchange occurs with M'L, and M'X is the reaction byproduct from the ligand exchange reaction. The metal M' is a different metal from the metal M.

The desorption operation generally has the following form:

$$ML \text{ (ads)} + M'X \text{ (ads)} \rightarrow ML \text{ (desorbed)} + M'X \text{ (desorbed)}$$

As noted above, the resulting molecules may be attached to each other forming dimers, trimers, or possibly even larger clusters. Examples of materials which may be etched using ALE processes in accordance with the present disclosure, include the following: metal oxides, binary metal oxides ($M_xM'_yO_z$), metal nitrides, binary metal nitrides, metal sulfides, metal phosphides, metal arsenides, metal tellurides, metal sellinides.

When using an acid for the conversion reaction, in the case of an oxide, the reaction will form water; in the case of a nitride, will form ammonia; in the case of a sulfide, will form hydrogen sulfide; for a phosphide, will form phosphine (PH$_3$); for an arsenide, will form arsine; for a telluride, will form tellurium hydride; for a sellinide, will form hydrogen sellinide.

In some implementations, ALE processing is performed at pressures in the range of about 100 mTorr to 10 Torr absolute or partial pressure. In some implementations, ALE processing is performed at a temperature in the range of about 100 to 450 C.

In accordance with various implementations, several process flows for performing ALE are disclosed. In some implementations, an ALE process that employs fluorine for purposes of surface conversion has reactions of the following form:

$$MY_x(s) + F \text{ source} \rightarrow MF_z(s) + Y_zH \text{ (g)},$$

wherein $Y_x$ is an oxide, nitride, metal, or other species, and wherein the reaction with the F source is a self-limiting thermal, plasma or photolytic process; and, $$MF_z(s) + M'L_n(g) \rightarrow ML_mF_{z-m}(g) + M'L_{n-m}F_m(g),$$

that is a thermally driven conversion and desorption reaction, and is self-limiting in $MF_z$.

An example process for etching aluminum nitride employs the following reactions:

$$AlN(s) + 3HF(g) \rightarrow AlF_3(s) + NH_3(g);$$

$$AlF_3(s) + Al(CH_3)_3(g) \rightarrow AlF_2(CH_3)(g) + AlF(CH_3)_2(g).$$

An example process for etching aluminum oxide employs the following reactions:

$$Al_2O_3(s) + 6HF(g) \rightarrow 2AlF_3(s) + 3H_2O(g);$$

$$AlF_3(s) + Al(CH_3)_3(g) \rightarrow AlF_2(CH_3)(g) + AlF(CH_3)_2(g).$$

An example process for etching titanium oxide employs the following reactions:

$$TiO_2(s) + 4HF(g) \rightarrow TiF_4(s) + 2H_2O(g);$$

$$\tfrac{3}{4}TiF_4(s) + BCl_3(g) \rightarrow \tfrac{3}{4}TiCl_4(g) + BF_3(g).$$

It is noted that a plasma process could be used to anisotropically etch after the thermal conversion step, e.g. using $H_2/Ar$, $BCl_3/Ar$ or He plasma.

Figure 2B:
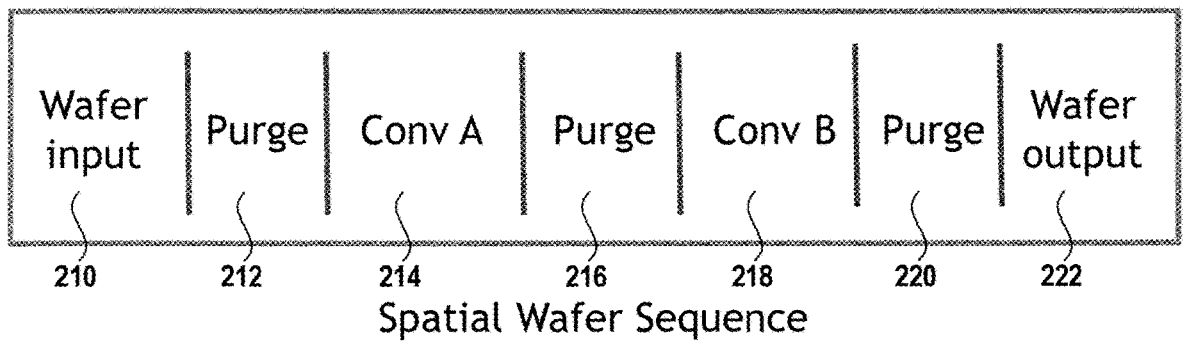
FIG. 2B conceptually illustrates a spatial wafer processing sequence, in accordance with implementations of the disclosure.

FIG. 2B conceptually illustrates a spatial wafer processing sequence for performing ALE, in accordance with implementations of the disclosure. A wafer/substrate can be moved through various process zones of a spatial processing tool, with each process zone performing a different function in the ALE process. It will be appreciated that in some implementations, the wafer is moved to a given process zone in its entirety before the process operation of that zone is initiated, whereas in other implementations, the process zones are continually active as the wafer moves through them, such that multiple ones of the described operations may occur simultaneously across different portions of the wafer depending upon the wafer's positioning within the system. At operation 210, the wafer is loaded/input into the tool. At operation 212, the wafer undergoes a first purge operation. At operation 214, the wafer undergoes a first conversion reaction (e.g. surface conversion reaction). At operation 216, the wafer undergoes a second purge operation. At operation 218, the wafer undergoes a second conversion reaction (e.g. ligand exchange and thermal or other energy application). At operation 220, the wafer undergoes a third purge operation. At operation 222, the wafer is output from the process tool.

Figure 2C:
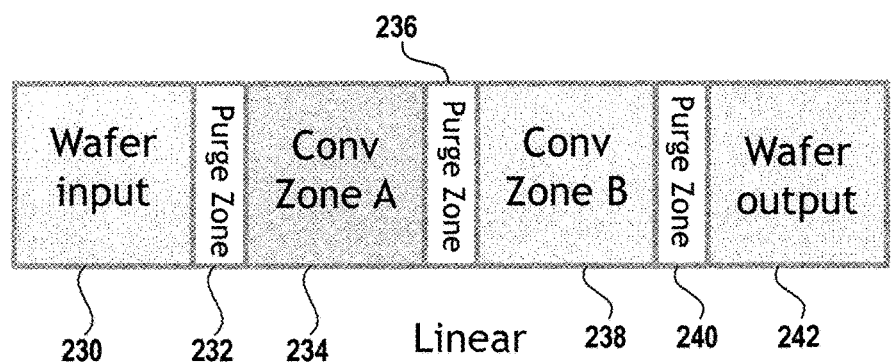
FIG. 2C conceptually illustrates a linear spatial wafer processing tool for performing ALE, in accordance with implementations of the disclosure.

FIG. 2C conceptually illustrates a linear spatial wafer processing tool for performing ALE, in accordance with implementations of the disclosure. A wafer to be processed is loaded to a wafer input stage 230. In succession, the wafer is moved through a purge zone 232 that effects a first purge, a first conversion zone 234 that effects a first conversion reaction, a purge zone 236 that effects a second purge, a second conversion zone 238 that effects a second conversion reaction, a purge zone 240 that effects a third purge, and finally to a wafer output stage 242. The wafer is removed from the wafer output stage 242 after processing is complete.

Figure 2D:
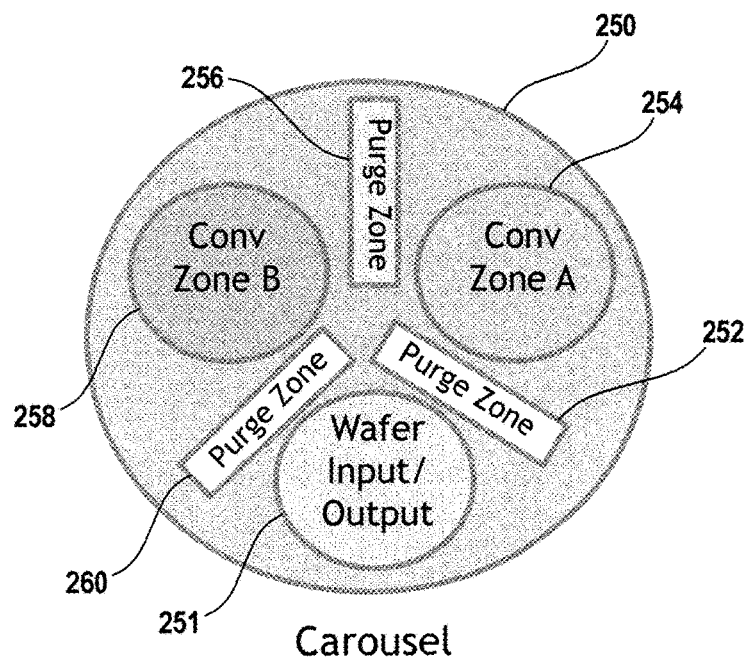
FIG. 2D conceptually illustrates a carousel spatial wafer processing tool for performing ALE, in accordance with implementations of the disclosure.

FIG. 2D conceptually illustrates a carousel spatial wafer processing tool for performing ALE, in accordance with implementations of the disclosure. A wafer to be processed is loaded to a wafer input/output stage 251 of a rotating carousel 250. As the carousel 250 is rotated, the wafer is moved to/through various process zones of the tool. In succession, the wafer is moved through a purge zone 252 that effects a first purge, a first conversion zone 254 that effects a first conversion reaction, a purge zone 256 that effects a second purge, a second conversion zone 258 that effects a second conversion reaction, a purge zone 260 that effects a third purge, and finally back to the wafer input/output stage 251. The wafer is removed from the wafer input/output stage 251 after processing is complete.

Figure 2E:
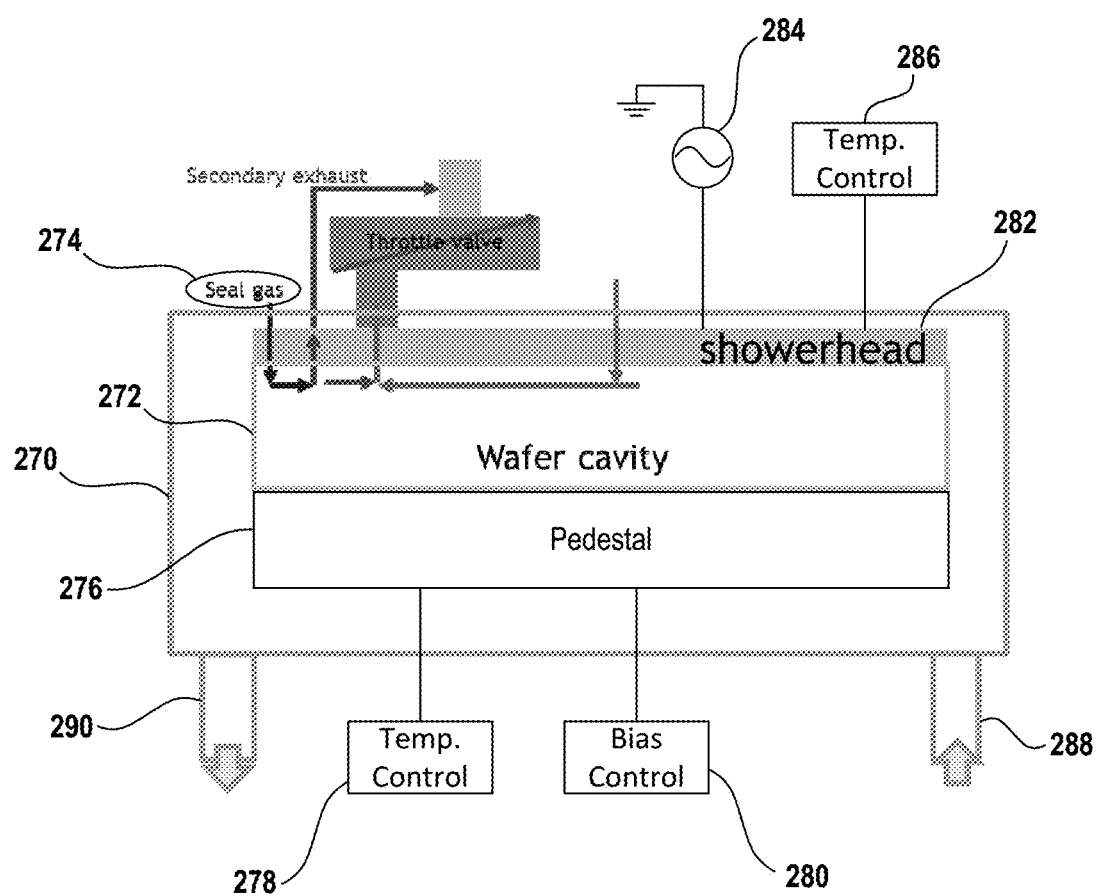
FIG. 2E conceptually illustrates a cross-section view of an example process station within a multi-station tool, in accordance with implementations of the disclosure.

In some implementations, a wafer is moved between a plurality of process stations within a multi-station processing tool. FIG. 2E conceptually illustrates a cross-section view of an example process station within a multi-station tool, in accordance with implementations of the disclosure. Broadly speaking, the process station defines a small volume chamber 272 within a larger chamber 270 with a seal gas 274. The chamber 272 is independently exhausted, and enables pressure cycling in a small volume for effective dosing/conversion and purging. Such a configuration provides for isolation of corrosive species, protecting ceramic or metal parts. Also, the configuration provides isolation for contamination control.

A pedestal 276 supports the wafer during processing. The pedestal may be temperature controlled using a temperature control 278, and bias power can be controlled using a bias control 280.

The showerhead 282 dispenses process gases into the wafer cavity. There can be multiple gas inlets (e.g. dual plenum). The showerhead may have RF capability (e.g. dual frequency) from an RF source 284, and may be temperature controlled using a temperature control 286.

By way of example without limitation, cleaning can be accomplished using a remote plasma source or in situ.

The larger chamber 270 may have independent pumping, e.g.

pumping into the chamber 270 through intake 288 and pumping out of the chamber 270 through exhaust 290. Purge capability is provided in the larger chamber 270 so that when wafers are transferred between stations, they are purged of any process gases or reaction byproducts to avoid cross-contamination between stations. Furthermore, the larger chamber 270 is provided with a contamination controlled insert capability to prevent external contamination.

Figure 3:
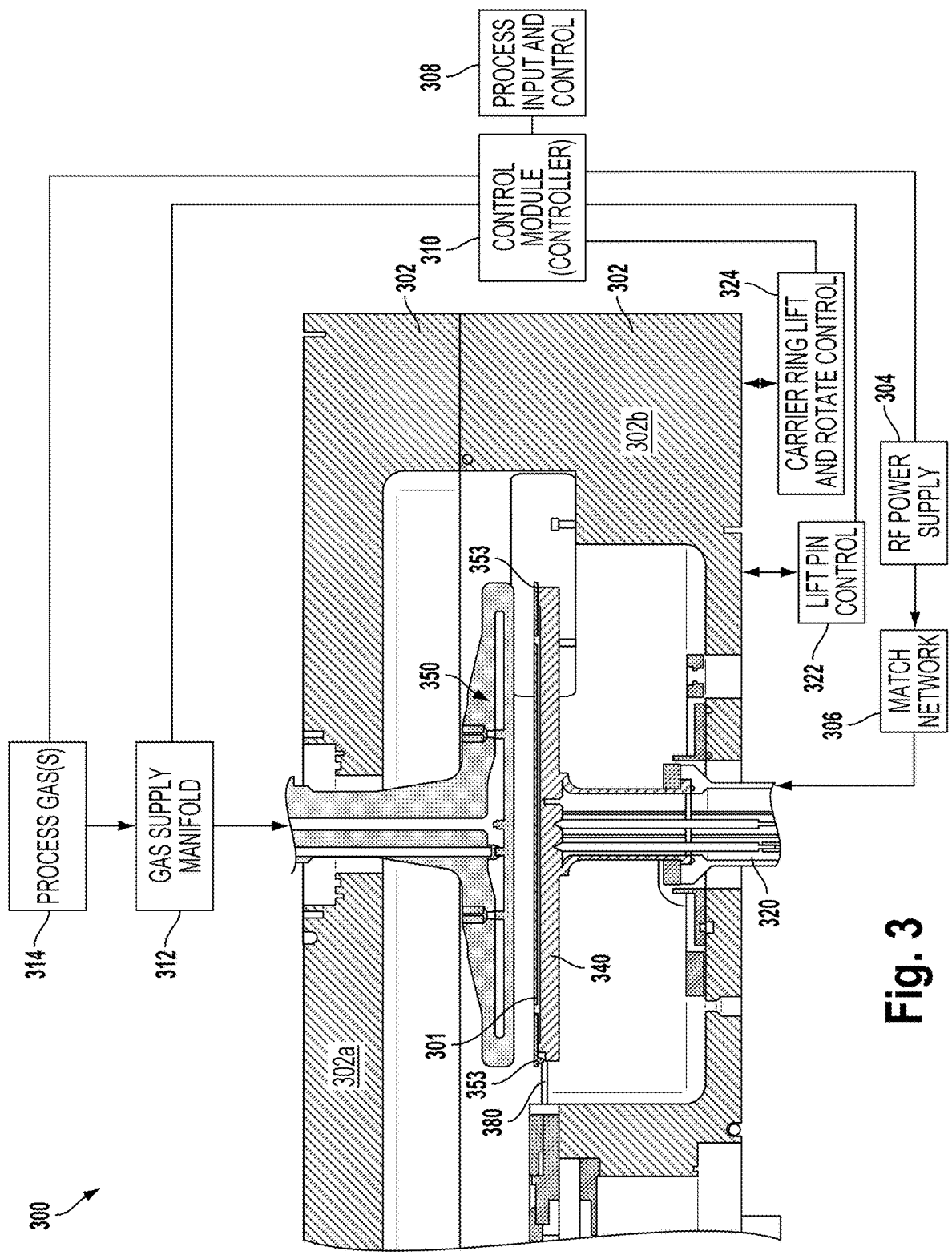
FIG. 3 illustrates a substrate processing system 100, which may be used for performing temporal based ALE processing of a substrate 301, in accordance with implementations of the disclosure.

FIG. 3 illustrates a substrate processing system 100, which may be used for performing temporal based ALE processing of a substrate 301, in accordance with implementations of the disclosure. Although FIG. 3 is described in regard to temporal based ALE processing, it should be understood that in other implementations, a spatial ALE system can utilize some of the same or similar controls and system facilities, e.g., such as gas feeds, process gases, RF power sources, showerheads, etc.

With this in mind, the system of FIG. 3 includes a chamber 302 having a lower chamber portion 302b and an upper chamber portion 302a. A center column is configured to support a pedestal 340, which in one embodiment is a powered electrode. The pedestal 340 is electrically coupled to power supply 304 (e.g., RF power source) via a match network 306. The power supply 304 may be defined from a single generator having two or more selectable and mutually exclusive oscillators. The power supply 304 is controlled by a control module 310, e.g., a controller. The control module 310 is configured to operate the substrate processing system 300 by executing process input and control 308. The process input and control 308 may include process recipes, such as power levels, timing parameters, shuttle speed (for spatial implementations), RF power levels, ground settings, process gasses, flow rates, mechanical movement of the substrate 301, etc., such for ALE processing of the substrate 301. In spatial ALE implementations, process input may, in some embodiments, provide the timing, speed, duration and motion control of a shuttle to enable spatial ALE processing with a moving RF source.

The center column is also shown to include lift pins 320, which are controlled by lift pin control 322. The lift pins 320 are used to raise the substrate 301 from the pedestal 340 to allow an end-effector to pick the substrate and to lower the substrate 301 after being placed by the end-effector. The substrate processing system 300 further includes a gas supply manifold 312 that is connected to process gases 314, e.g., gas chemistry supplies from a facility. Depending on the processing being performed, the control module 310 controls the delivery of process gases 314 via the gas supply manifold 312. The chosen gases are then flown into the shower head 350 and distributed in a space volume defined between the showerhead 350 face which faces the substrate 301 and the substrate 301 resting over the pedestal 340. In ALE processes, the gases can be reactants chosen for surface conversion or for ligand exchange operations in accordance with processes described herein.

Further, the gases may be premixed or not. Appropriate valving and mass flow control mechanisms may be employed to ensure that the correct gases are delivered during the deposition and plasma treatment phases of the process. Process gases exit the chamber via an outlet. A vacuum pump (e.g., a one or two stage mechanical dry pump and/or a turbomolecular pump) draws process gases out and maintains a suitably low pressure within the reactor by a close loop controlled flow restriction device, such as a throttle valve or a pendulum valve.

Also shown is a carrier ring 353 that encircles an outer region of the pedestal 340. The carrier ring 353 is configured to sit over a carrier ring support region that is a step down from a substrate support region in the center of the pedestal 340. The carrier ring includes an outer edge side of its disk structure, e.g., outer radius, and a substrate edge side of its disk structure, e.g., inner radius, that is closest to where the substrate 301 sits. The substrate edge side of the carrier ring includes a plurality of contact support structures which are configured to lift the substrate 301 when the carrier ring 353 is lifted by forks 380. The carrier ring 353 is therefore lifted along with the substrate 301 and can be rotated to another station, e.g., in a multi-station system, as controlled by carrier ring lift and rotate control 324. In other embodiments, the chamber is a single station chamber. In still other embodiments, the chamber is part of a spatial ALE chamber, which includes a shuttle and an edge ring. The edge ring may also be referred to as a focus ring, depending on the implementation.

In some implementations, RF power is supplied to an electrode of the chamber so that a plasma can be generated. In the spatial ALE chamber 400, the RF power source is coupled to the shuttle 402, which moves the substrate from process zone to process zone to complete one or more film deposition steps. More detail regarding a spatial ALE system is provided below with reference to FIG. 4.

FIG. 4 illustrates a top view of a multi-station processing tool, wherein four processing stations are provided, in accordance with implementations of the disclosure. This top view is of the lower chamber body 302b (e.g., with the top chamber portion 302a removed for illustration), wherein four stations are accessed by spider forks 426. Each spider fork or fork includes a first and second arm, each of which is positioned around a portion of each side of the pedestal 340. In this view, the spider forks 426 are drawn in dash-lines, to convey that they are below the carrier ring 400. The spider forks 426, coupled to a rotating mechanism 420, are configured to raise up and lift the carrier rings 400 (i.e., from a lower surface of the carrier rings 400) from the stations simultaneously, and then rotate at least one or more stations before lowering the carrier rings 400 (where at least one of the carrier rings supports a wafer 301) to a next location so that further processing (e.g. etch, deposition, plasma processing, treatment, etc.) can take place on respective wafers 301.

FIG. 5 shows a schematic view of an embodiment of a multi-station processing tool 500 with an inbound load lock 502 and an outbound load lock 504, in accordance with implementations of the disclosure. A robot 506, at atmospheric pressure, is configured to move substrates from a cassette loaded through a pod 508 into inbound load lock 502 via an atmospheric port 510. Inbound load lock 502 is coupled to a vacuum source (not shown) so that, when atmospheric port 510 is closed, inbound load lock 502 may be pumped down. Inbound load lock 502 also includes a chamber transport port 516 interfaced with processing chamber 302b. Thus, when chamber transport 516 is opened, another robot (not shown) may move the substrate from inbound load lock 502 to a pedestal 340 of a first process station for processing.

The depicted processing chamber 302b comprises four process stations, numbered from 1 to 4 in the embodiment shown in FIG. 5. In some embodiments, processing chamber 302b may be configured to maintain a low pressure environment so that substrates may be transferred using a carrier ring 400 among the process stations without experiencing a vacuum break and/or air exposure. Each process station depicted in FIG. 5 includes a process station substrate holder (shown at 318 for station 1) and process gas delivery line inlets.

FIG. 5 also depicts spider forks 426 for transferring substrates within processing chamber 302b. The spider forks 426 rotate and enable transfer of wafers from one station to another. The transfer occurs by enabling the spider forks 426 to lift carrier rings 400 from an outer undersurface, which lifts the wafer, and rotates the wafer and carrier together to the next station. In one configuration, the spider forks 426 are made from a ceramic material to withstand high levels of heat during processing.

In some embodiments, a "ring-less" substrate transfer may also be employed. In such embodiments, the "carrier ring" or "plasma focusing ring" remains fixed on one station. The substrate is moved by lifting the substrate off of the pedestal with pins, inserting a paddle under the wafer, and then lowering the substrate on pins thus ensuring direct contact with the paddle to substrate. At this point, the substrate is indexed using the paddle to another station. Once the substrate is at the new station, the substrate is lifted off of the paddle with pins, the paddle is rotated or moved out and the pins are lowered to ensure direct contact of the substrate to the pedestal. Now, the substrate processing can proceed at the new station for the indexed (i.e., moved) substrate. When the system has multiple stations, each of the substrates (i.e., those present at stations) can be transferred together, e.g., simultaneously, in the similar fashion for ring-less substrate transfers. Additional details regarding multi-station process tools can be found with reference to U.S. application Ser. No. 14/839,675, filed Aug. 28, 2015, entitled "Multi-Station Chamber Having Symmetric Grounding Plate," the disclosure of which is incorporated by reference herein.

Figure 6A:
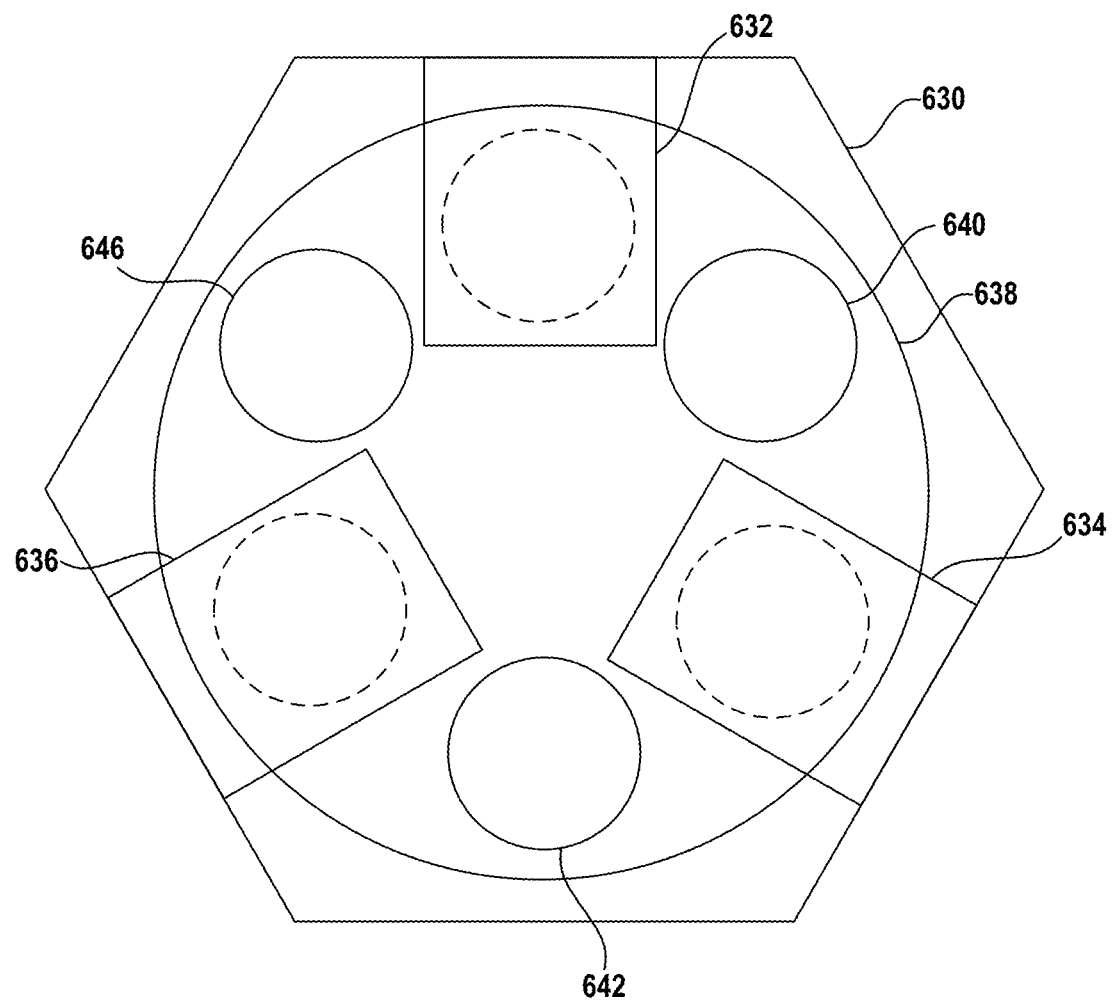
FIG. 6A illustrates an example spatial ALE system, in accordance with one embodiment.

FIG. 6A illustrates an example spatial ALE system, in accordance with one embodiment. The spatial ALE system 630 includes a plurality of process zones 632, 634, 636, for processing the substrates 640, 642, and 646, which are moved through the process zones on a carousel 638.

Figure 6B:
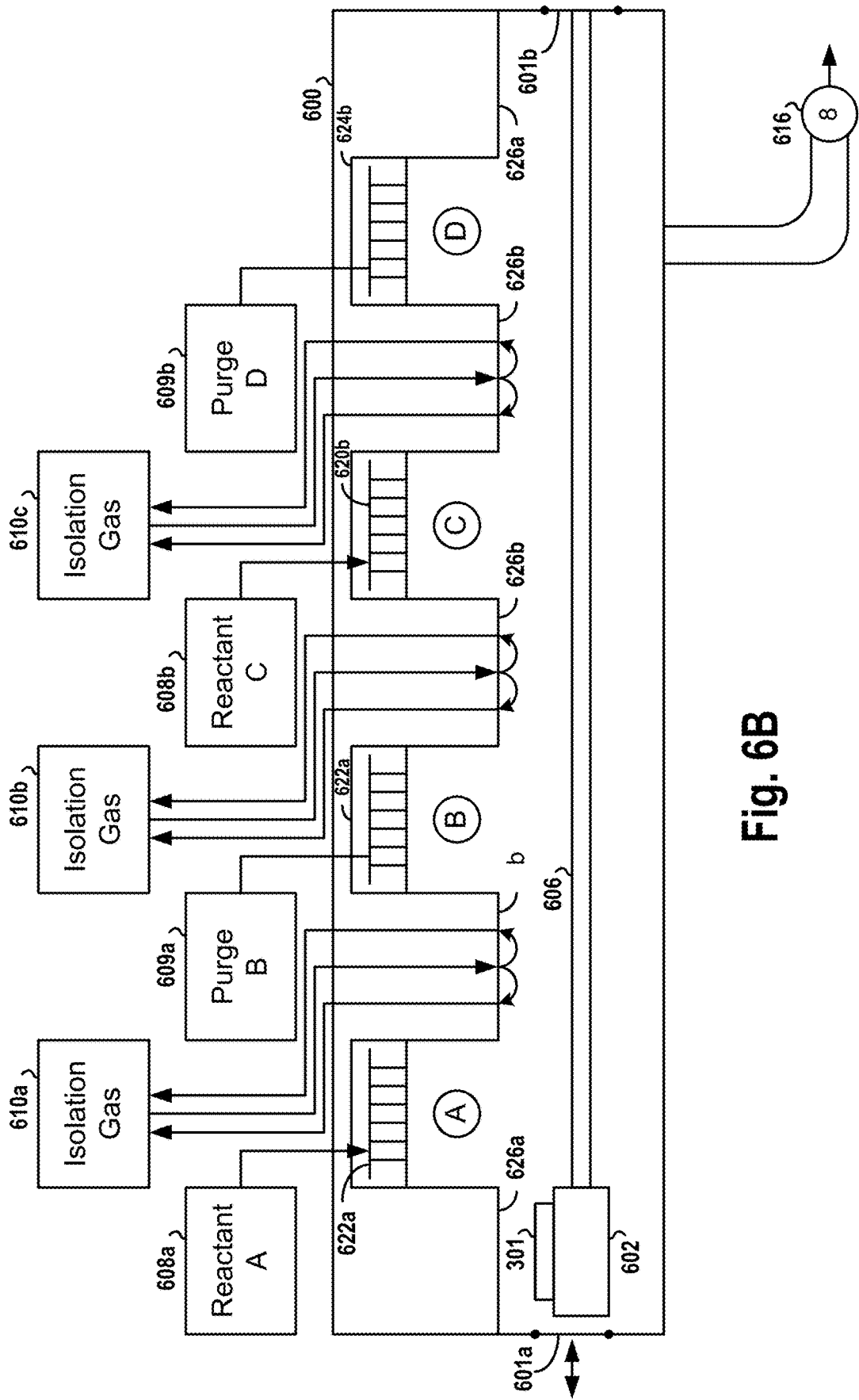
FIG. 6B illustrates an example spatial ALE system, in accordance with one embodiment.

FIG. 6B illustrates an example spatial ALE system, in accordance with one embodiment. The spatial ALE system includes a chamber 600 that has a plurality of zones for processing the substrate 301. The substrate 301 is supported by a shuttle 602, and the shuttle 602 is configured to transport or move the substrate 301 to each of the zones A-D. In one embodiment, substrates are introduced into the chamber 600 via an access port 601a. In some embodiments, an access port 601b is also provided at the end near zone D. Substrates are introduced into the chamber 600 via a load port, which may be interfaced with the access ports. The chamber 600 is, in one embodiment, under vacuum, so the load port assists in transferring substrates into and out of the chamber 600. In one embodiment, the chamber 600 may be configured to operate at pressures in the range of about 0.1 to 10 Torr. As shown, a pump 616 may also be included as part of the chamber 600, which may assist in removing gas flows, pumping the chamber to desired pressures, or to enable service operations.

In other embodiments, chamber 600 may be clustered with other chambers or tools, to define a larger architecture system. In some embodiments, fewer zones are provided, such as only providing zones A-C. In general, zone A is configured to provide a reactant gas 608a, and distribute the reactant gas 608a over the zone A, such that the reactant gas 608a is quickly distributed over and reacts with a surface or layer disposed on the substrate 601. In some embodiments, zone B is not required, and a system may omit processing or structures associated with zone B. In such cases, the process my progress from zone A (application of reactant A) to zone C (application of reactant C).

A showerhead 620a is provided in zone A, and is used to provide and distribute the reactant gas 608a. In operation, the shuttle 602 will move the substrate 301 to a location that is under the showerhead 608a of zone A. Once the gases have been absorbed from reactant gases 608a, the shuttle moves the substrate 301 toward zone B. Between zone A and zone B, an isolation surface 626b is provided. Opposite isolation surface 626b is isolation surface 626a. Between the isolation surfaces, which represent lowered structural surfaces or body of the upper chamber 600, the zone A is defined. Each of the other zones B, C and D are respectively disposed between isolation surfaces 626. Isolation surfaces 626b, for example, also include a plurality of inlet ports and outlet ports. The inlet ports are configured to provide an inert gas and the outlet ports are configured to remove the inert gas and other gas byproducts, such as to provide an isolation between the zones.

In the illustrated embodiment, the shuttle will pass under isolation surface 626b on its way to zone B, wherein a purge 609a process is performed by a purge head 624a and other gas pumping equipment near or around zone B. The purge process is configured to evacuate reactants that may be disposed over or around the zone B or over the substrate when present in zone B, i.e., when moved to zone B by the shuttle 602. In one example, the operation in zone B may take between 20 and 300 ms, depending on the recipe being processed. Next, the shuttle 602 is moved to zone C, while passing under isolation surface 626b. As noted above, isolation surface 626b is controlled by isolation gas and the input ports and outlet ports that are in communication with isolation gas 610b. Isolation gas 610a-610c, for example, are configured to provide inert gas to the input ports of the isolation surface 626b, and remove inert gas and byproducts of the reacting gases, which may be disposed or routed to other exhaust infrastructure.

Once the shuttle 602 is moved to zone C, the system controller 610 can be configured to activate the RF power source 640 that delivers power to the RF electrodes embedded in the shuttle 602. In some implementations, the electrodes embedded in the shuttle include an RF power electrode and an RF ground electrode. In this manner, the controller 610 can activate the power source to deliver RF power to the electrodes of the shuttle 602 when the shuttle has reached zone C of the chamber 600. In one embodiment, the RF power provided by the electrodes of the shuttle 602 can range between 75 watts and 1000 watts, and in another embodiment between 250 watts and 300 watts. The power setting provided during operation, which may fall between the above noted ranges, will depend upon the process recipe being implemented in the spatial ALE system. Further, processing in zone C may range between about 25 ms to about 3 seconds, on average, depending on the recipe. Again, this duration is based on the target process, the material types, the etch amount desired from the ALE step, and other variables.

In accordance with some implementations, in zone C, the RF power provided to the shuttle 602, having the substrate 301 disposed thereon, will produce a plasma over the surface of the substrate 301. The space in and around zone C is filled with gas from reactant 608b, which will be activated over the surface of the substrate 301 when the power is set to be activated. In one embodiment, the power is set to be activated in a synchronous manner, such that when the substrate 301 reaches an area under zone C, the RF power is activated. In one embodiment, the reactant 608b is chosen such that a reaction will occur between the reactant 608b delivered by a showerhead 620b and the reactant 608a that was absorbed by the substrate in zone A. In one configuration, the shuttle 602 has been moved to zone D, where a purge 609b process is performed, similar to the operation performed in zone B. In zone D, the operation may last, depending on the desired recipe, between about 20 and 150 ms, and in some cases, between about zero and 300 ms.

Additional details regarding spatial processing systems can be found in U.S. application Ser. No. 14/846,697, filed Sep. 4, 2015, entitled "Plasma Excitation for Spatial Atomic Layer Deposition (ALD) Reactors," the disclosure of which is incorporated by reference herein. Though the disclosed embodiments of U.S. application Ser. No. 14/846,697 are described with reference to ALD processes, its disclosure can also be applied for ALE processing, which will be readily apparent to those skilled in the art.

Figure 7:
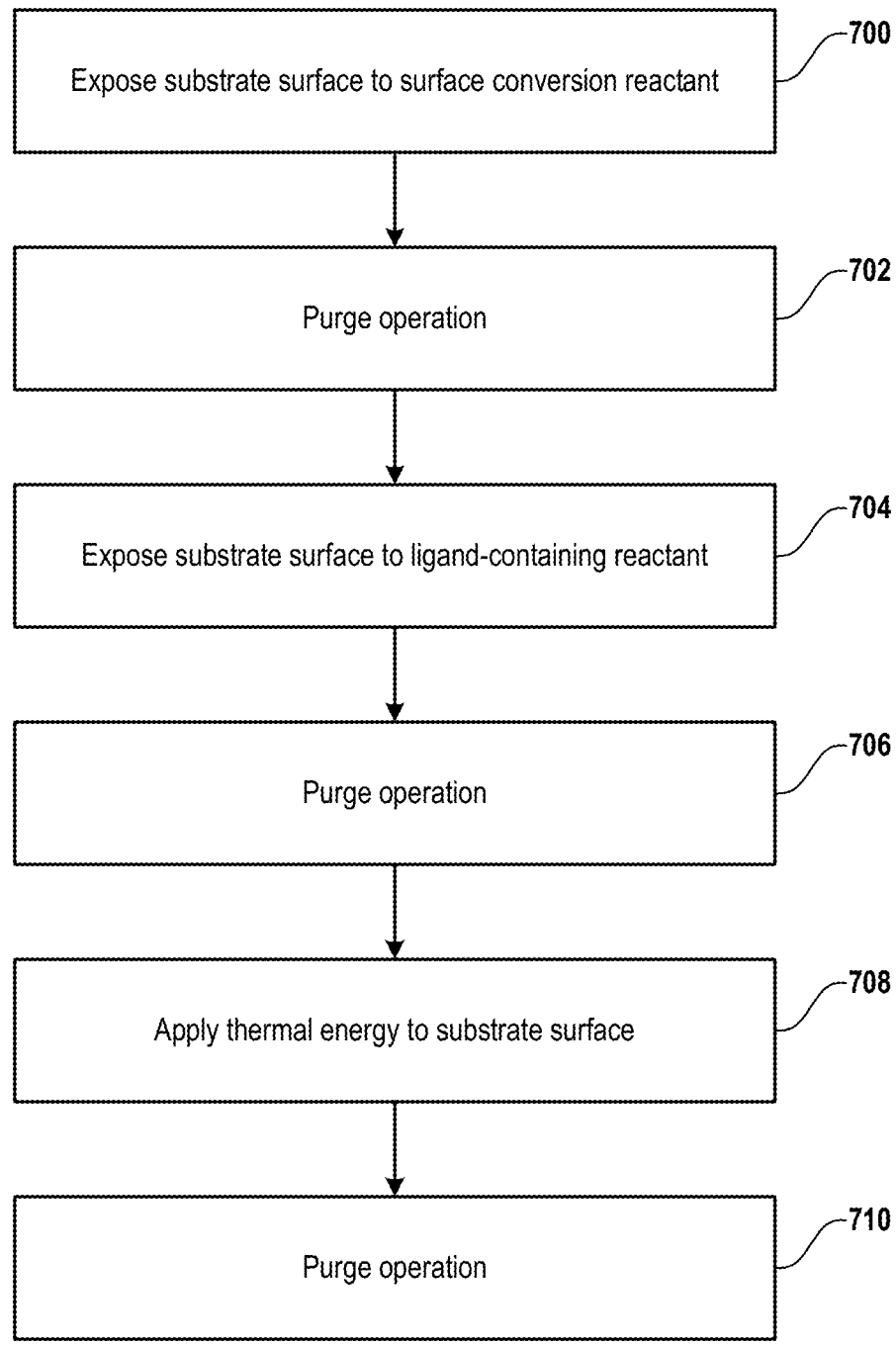
FIG. 7 illustrates a method for performing ALE processing of a substrate/wafer, in accordance with implementations of the disclosure.

FIG. 7 illustrates a method for performing ALE processing of a substrate/wafer, in accordance with implementations of the disclosure. At method operation 700, the substrate is exposed to a surface conversion reactant, which is configured to react in a self-limiting fashion with the outermost layer of surface molecules/atoms on the substrate surface. When performed in a temporal ALE system, the surface conversion reactant is flowed into the process chamber in which the substrate is disposed. Whereas when performed in a spatial ALE system, the substrate is moved into a process region that dispenses the surface conversion reactant. The surface conversion reactant reacts with the surface molecules/atoms to form a converted species.

At method operation 702, a purge operation is performed, to remove any reaction byproducts and/or any unreacted surface conversion reactant. In a temporal ALE system, this may be accomplished by purging the chamber with an inert gas. In a spatial ALE system, the substrate is moved into a purge region of the ALE system.

At method operation 704, the substrate is exposed to a ligand-containing reactant. In a temporal ALE system, the surface conversion reactant is flowed into the process chamber in which the substrate is disposed. Whereas in a spatial ALE system, the substrate is moved into a process region that dispenses the surface conversion reactant. The ligand-containing reactant is configured to react with the converted species on the substrate surface in a self-limiting fashion to transform the converted species into ligand-substituted species on the substrate surface. That is, ligand-containing reactant adsorbs on the substrate surface and the ligands from the ligand-containing reactant are transferred to the converted species, via a substitution reaction.

At method operation 706, a second purge operation is performed, e.g. by flowing an inert gas into the chamber in a temporal system, or by moving the substrate into a purge region in a spatial system.

In some implementations, the ligand-substitution reaction also liberates the ligand-substituted species from the substrate surface in the same reaction operation. For example, the temperature of the chamber and/or substrate may be such that upon formation of the ligand-substituted species, the ligand-substituted species is volatilized and released from the substrate surface.

However, in other implementations, the ligand exchange reaction does not also produce desorption of the ligand-substituted species that is the reaction product, and a separate operation is required to achieve desorption. In accordance with such implementations, with continued reference to FIG. 7, at method operation 708, thermal energy is applied to the substrate surface following the purge operation 706, in order to effect desorption of the ligand-substituted species on the substrate surface. The thermal energy can be applied using any of a variety of techniques, alone or in combination, in accordance with implementations of the disclosure. In some implementations, the process chamber is heated in order to provide thermal energy to the substrate, such as by heating the chamber walls and/or heating the pedestal. In some implementations, the process chamber and/or the substrate are heated by one or more lamps (e.g. infrared lamps). One example of a system using lamps to transfer energy to a substrate is the SOLA® thermal processing system manufactured by Lam Research Corporation.

In some implementations, lasers are used to heat the substrate surface. In some implementations the lasers can be targeted so as to selectively heat certain portions of the substrate. The targeted portions will have sufficient thermal energy to achieve desorption of the outer layer of ligand-substituted species, while those portions that are not targeted will not be etched as they lack the requisite thermal energy to achieve desorption.

In some implementations, the pedestal on which the substrate is situated is heated so as to transfer heat to the substrate to effect desorption.

At method operation 710, a purge operation is performed to ensure complete removal of desorbed species and any other byproducts from the process chamber.

In the method of FIG. 7, it will be appreciated that the temperature at which the desorption operation is performed is greater than the temperature at which the ligand exchange operation is performed. In some implementations, the temperatures at which the surface conversion and the ligand exchange operations are performed at the same. In other implementations, the temperature at which the surface conversion operation is performed is less than the temperature at which the ligand exchange operation is performed, thus yielding an ALE cycle wherein temperature is progressively increased with each operation of the ALE cycle.

In other words, the surface conversion operation may be performed at a first temperature, the ligand exchange reaction may be performed at a second temperature higher than the first temperature, and the desorption operation may be performed at a third temperature higher than the second temperature. In such implementations, the desorption is performed as a separate operation from the ligand exchange operation.

It will be appreciated that the reactions/operations which occur during the ALE process may be thermally driven, such that the reaction or operation may not occur unless a threshold temperature is provided as a process condition. Therefore, the temperature of the substrate and/or the process chamber can be controlled so as to provide the appropriate temperature condition to drive the reactions of the ALE cycle.

In other implementations, the surface conversion is performed at a first temperature, and the ligand exchange and desorption are performed in the same operation at a second temperature higher than the first temperature. In such implementations, the ligand exchange reaction and desorption occur simultaneously or as part of the same operation, as the ligand-substituted species are desorbed upon formation.

Figure 8:
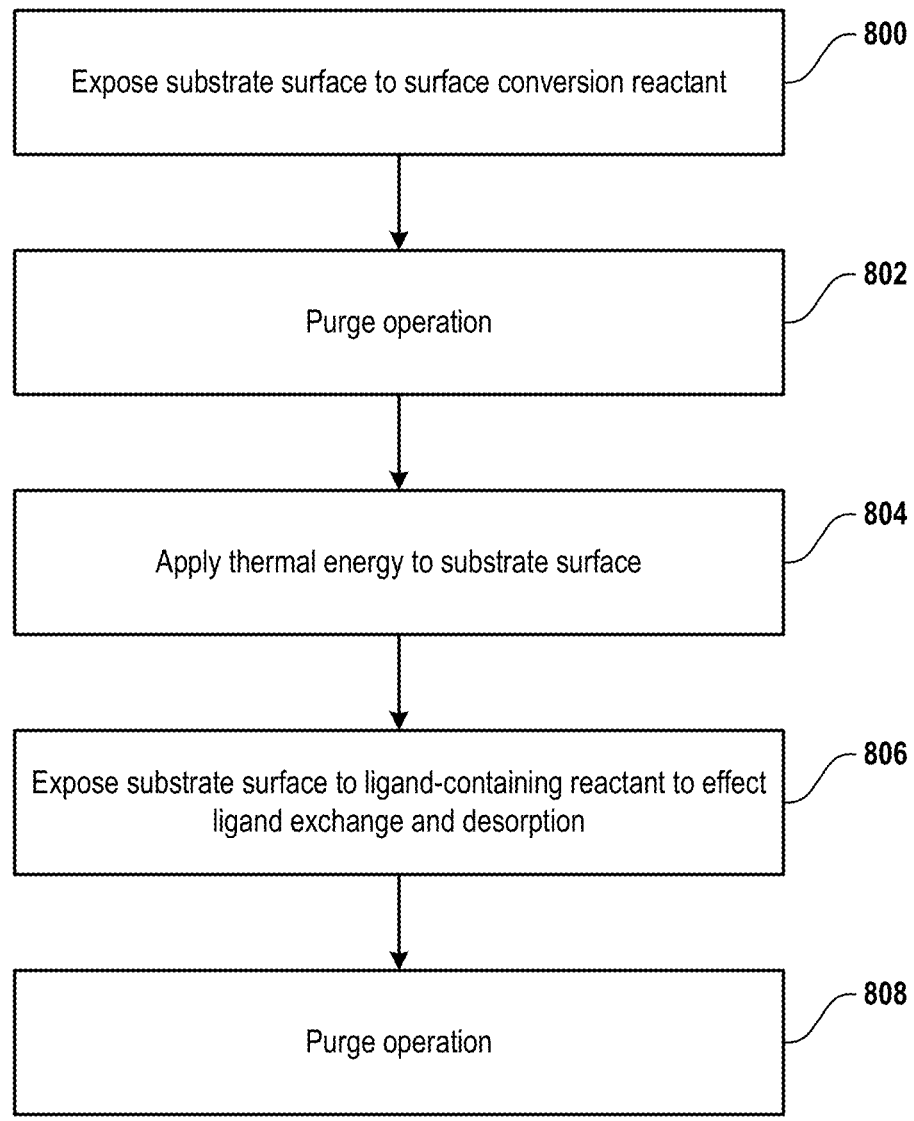
FIG. 8 illustrates a method for performing ALE processing of a substrate, in accordance with implementations of the disclosure.

FIG. 8 illustrates a method for performing ALE processing of a substrate, in accordance with implementations of the disclosure. At method operation 800, the substrate surface is exposed to a surface conversion reactant. At method operation 802, a purge operation is performed.

At method operation 804, thermal energy is applied to the substrate surface, e.g. by heating the process chamber, the pedestal, and/or the substrate directly. Any of the techniques for applying thermal energy described above can be employed. The effect is to increase the temperature of the substrate from the first temperature at which the surface conversion operation was performed to a higher second temperature at which the ligand exchange reaction is performed and at which desorption is achieved.

At method operation 806, the substrate surface is exposed to a ligand-containing reactant, which adsorbs on the substrate surface to effect the ligand exchange reaction and desorption of the reaction product in the same operation. That is, upon formation of the ligand-substituted species (that is the reaction product) through the ligand exchange reaction, the ligand-substituted species is configured to desorb from the substrate surface at the temperature to which the substrate and/or the chamber has been heated.

It is noted that for thermal processes such as have been described in the methods of FIGS. 7 and 8, the etch behavior will typically be isotropic. This is significant as there are not many effective methods for achieving isotropic etching, and ALE in accordance with implementations of the present disclosure can provide isotropic etching with atomic scale precision.

Figure 9:
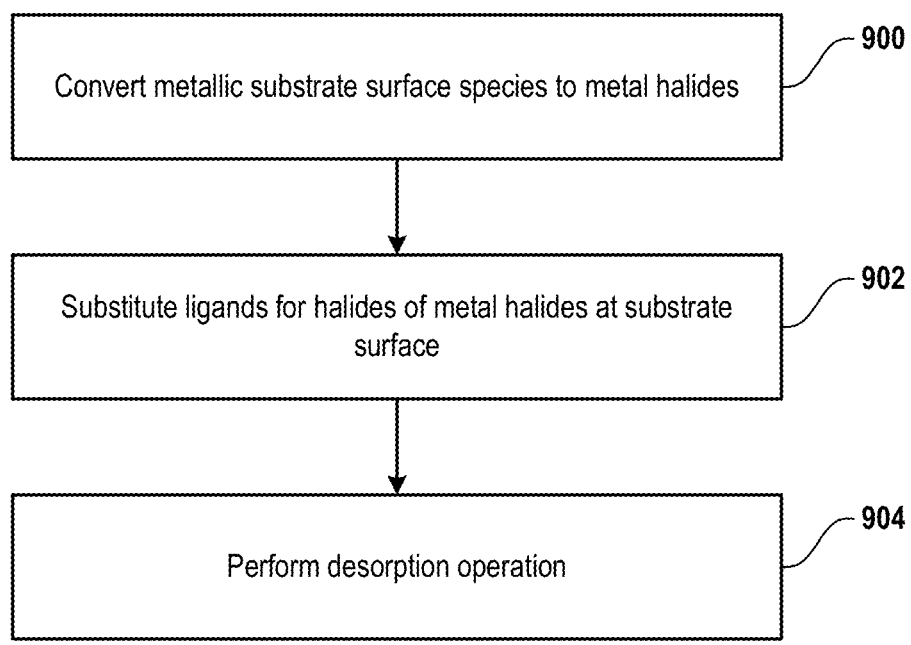
FIG. 9 illustrates a method for performing ALE using a halide species for surface conversion, in accordance with implementations of the disclosure.

FIG. 9 illustrates a method for performing ALE using a halide species for surface conversion, in accordance with implementations of the disclosure. At method operation 900, a metallic species on a substrate surface is converted to a metal halide by exposure to a halide containing reactant.

Examples of metal halides include metal chlorides, metal fluorides, metal bromides, and metal iodides.

Examples of chloride sources include the following: HCl, complexes of HCl, solutions of HCl, and plasma sources of Cl.

Examples of fluoride sources include the following: anhydrous HF (e.g. employing a low pressure process), adducts of HF (e.g. HF-pyridine) (e.g. employing a low pressure process), solutions of HF (e.g. may use spin-on technique to dispense onto substrate), plasma sources of F (e.g. HF—NF3 plasma) (plasma can be generated in situ or remotely), and other F sources (e.g. $ClF_3$, $SF_6$).

Examples of bromide sources include the following: HBr, complexes of HBr, solutions of HBr, and plasma sources of Br.

Examples of iodide sources include the following: HI, complexes of HI, solutions of HI, and plasma sources of I.

At method operation 902, a ligand exchange reaction is performed wherein ligands of a ligand-containing reactant are substituted for the halides of the converted surface species on the substrate.

Example of ligand-containing reactants include the following: Sn(acac)2, $Al(CH_3)_3$, $SiCl_4$, $Al(CH_3)2Cl$, $TiCl_4$, $Al(OR)_3$, $AlCl_3$, $M(OR)_n$, $M(NR_2)_n$, $M(acac)_n$, $BCl_3$.

If necessary, at method operation 904, a desorption operation is performed to achieve desorption of the reaction product from the substrate surface following the ligand exchange reaction. As noted above, in some implementations, desorption is achieved through the application of thermal energy. However, in other implementations, other techniques can be applied to achieve desorption.

It will be appreciated that the thermodynamics of specific reactions may govern which reactants are suitable for use in performing ALE on particular substrate surface species. For example, it is possible to etch alumina with HF and TMA. However, it is not thermodynamically favorable to etch Zirconia with HF and TMA, because while the surface conversion can happen, the ligand exchange is thermodynamically uphill.

For an HF conversion for alumina, followed by exposure to silicon tetrachloride, up until about 200 C little to no reaction occurs because until that temperature, the conversion and desorption is thermodynamically uphill. Therefore, it is necessary to provide thermal energy in order to overcome the kinetic barrier with temperature. Thus, in thermal processes in accordance with implementations of the disclosure, it is possible to use photo or plasma driven desorption, thereby providing another energy source to induce species desorption.

Figure 10:
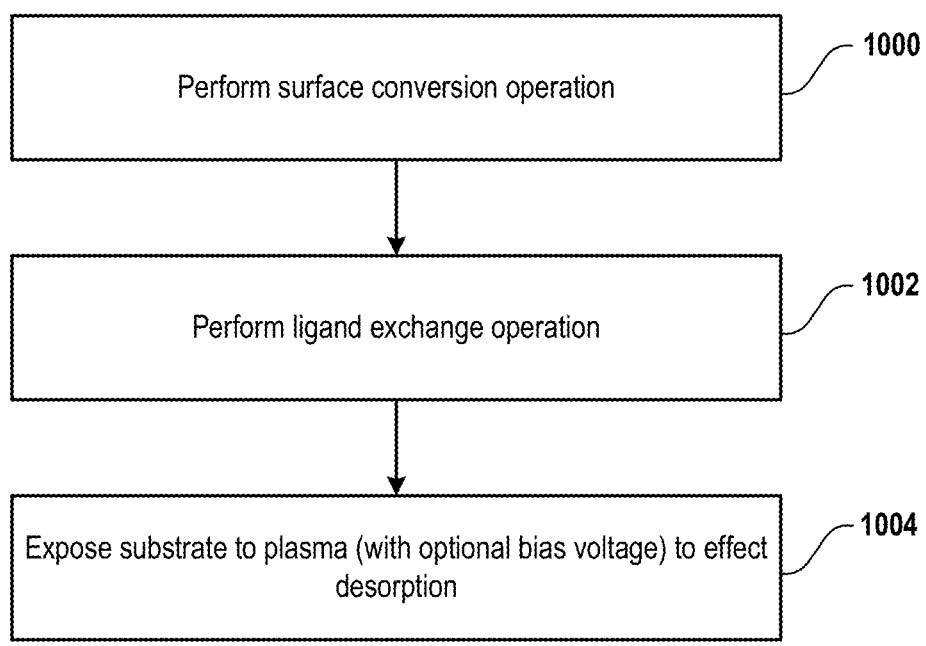
FIG. 10 illustrates a method for performing ALE, including a plasma induced desorption operation, in accordance with implementations of the disclosure.

FIG. 10 illustrates a method for performing ALE, including a plasma induced desorption operation, in accordance with implementations of the disclosure. At method operation 1000, a surface conversion operation is performed on the substrate, as described above in accordance with implementations of the disclosure. At method operation 1002, a ligand exchange operation is performed on the substrate, also as described above in accordance with implementations of the disclosure. At method operation 1004, the substrate is exposed to a plasma to effect desorption and removal of the reaction product and any other byproducts of the ligand exchange operation from substrate surface.

In some implementations, the plasma is generated in situ, for example using an inductively coupled plasma (ICP) mechanism, a capacitively coupled plasma (CCP) mechanism, or using microwaves. In other implementations, the plasma is generated remotely and supplied to the substrate surface.

The plasma activated desorption can occur via various mechanisms. For example, the plasma can generate photons (e.g. UV photons), and may effect photolytic desorption. The plasma may also generate activated species, such as radicals and/or ions, which promote the desorption. It will be appreciated that that the use of plasma-generated radicals will tend to provide isotropic etching.

In some implementations, ion based desorption may tend to be anisotropic. In some implementations, a bias voltage is applied to increase the anisotropy.

Broadly speaking, when desorption is effected through plasma generated ions, it is desirable to promote a gentle process (as compared to, e.g., RIE) to avoid sputtering the substrate surface material. Very low energy (e.g. a bias voltage of less than about 50 volts) should be employed to avoid physical etching/sputtering (wherein ion physically knocks off surface atoms). In ALE, it is desirable to only desorb a single monolayer in a given desorption operation. Thus, when using plasma for desorption, the system can be configured to generate very low ion energies that only effect desorption without physical sputtering, e.g. with very low bias power.

Figure 11:
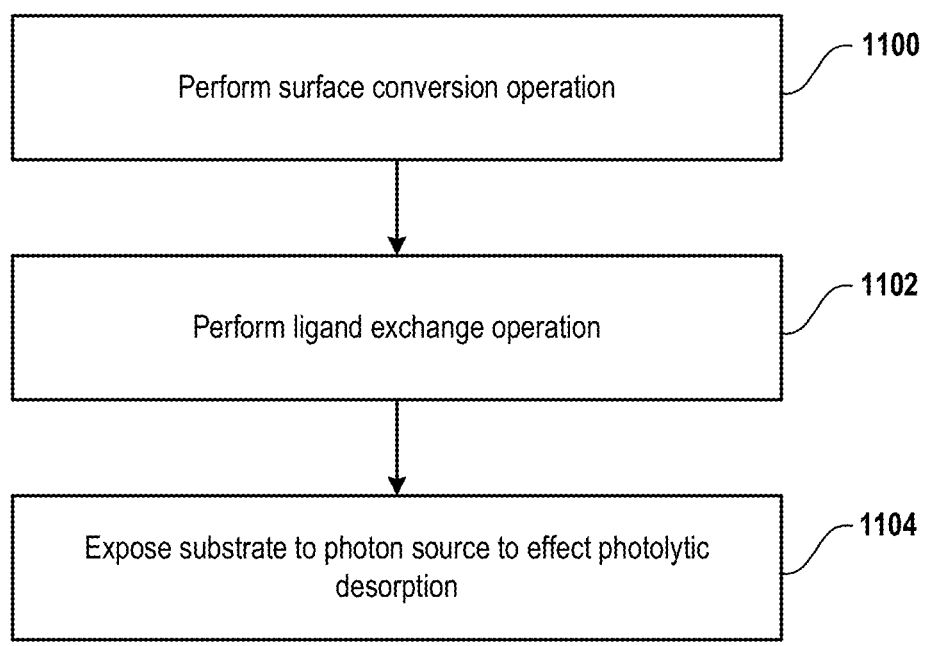
FIG. 11 illustrates a method for performing ALE, including a photon induced desorption operation, in accordance with implementations of the disclosure.

FIG. 11 illustrates a method for performing ALE, including a photon induced desorption operation, in accordance with implementations of the disclosure. At method operation 1100, a surface conversion operation is performed on the substrate, as described above in accordance with implementations of the disclosure. At method operation 1102, a ligand exchange operation is performed on the substrate, also as described above in accordance with implementations of the disclosure. At method operation 1104, the substrate is exposed to photons from a photon source to effect desorption and removal of the reaction product and any other byproducts of the ligand exchange operation from substrate surface.

The photon activated desorption (photodesorption) can be photolytic in nature, wherein the photon breaks bonds of the surface species to achieve cleavage/disassociation from the substrate surface and so enable their desorption. In some implementations, the photon exposure produces local heating which promotes desorption. It will be appreciated that these mechanisms may provide their effects in tandem with one another to achieve photodesorption. In some implementations, the photolytic action will cleave the bond to the substrate surface and the local heating will serve to increase volatility of the cleaved species and promote its removal.

Figure 12A:
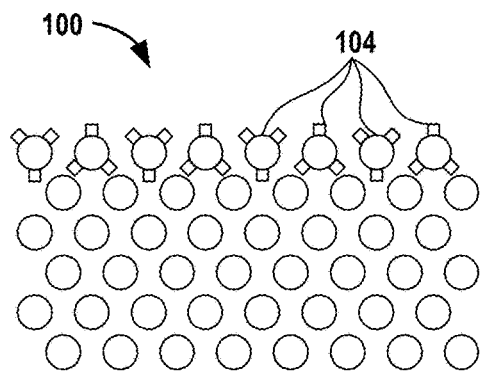
FIGS. 12A-12F conceptually illustrate an ALE process using targeted desorption techniques to achieve selective etching on a substrate, in accordance with implementations of the disclosure.
Figure 12D:
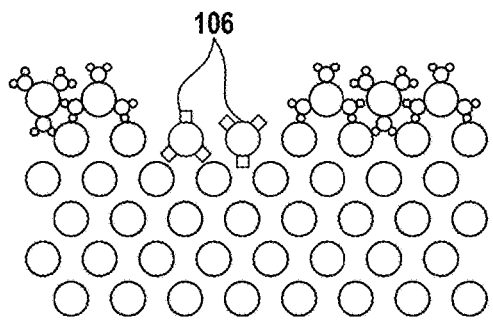
Figure 12B:
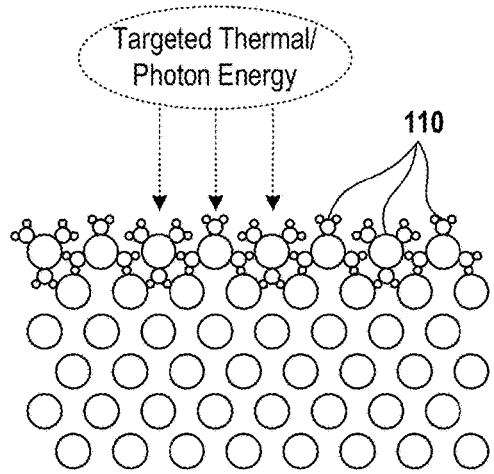
Figure 12E:
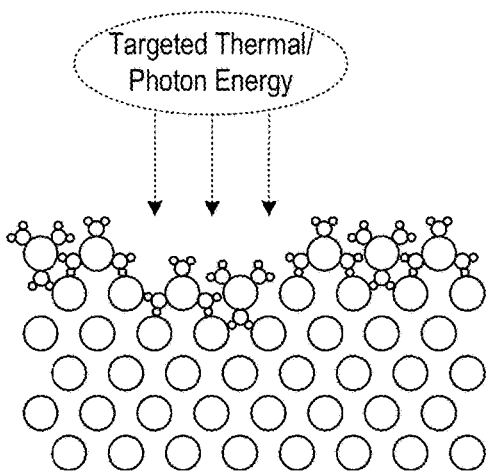
Figure 12C:
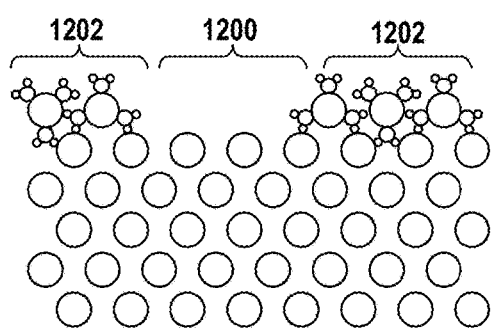

FIGS. 12A-12F conceptually illustrate an ALE process using targeted desorption techniques to achieve selective etching on a substrate, in accordance with implementations of the disclosure. FIG. 12A illustrates a portion of a substrate surface 100, wherein the topmost layer has undergone a surface conversion reaction to form surface converted species 106. FIG. 12B illustrates the substrate surface following the ligand exchange reaction, yielding ligand-substituted species 110 at the substrate surface. Targeted thermal or photon energy is applied to the substrate surface, which directs the thermal or photon energy to specific localized region(s) of the substrate surface. Following this local application of thermal or photon energy, as shown at FIG. 12C, the ligand-substituted species are desorbed and removed from the surface, but only in the region 1200 of the substrate surface, which is a region at which the thermal/photon energy was directed. The other regions 1202 which did not receive the targeted thermal/photon energy did not desorb the ligand-substituted species. The result is that the region 1200 has been selectively etched.

Figure 12F:
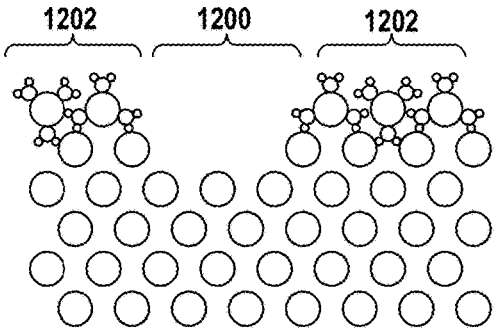

At FIG. 12D, the next ALE cycle begins with exposure of the substrate surface to the surface conversion reactant, which reacts with the available surface species in the region 1200. The other ligand-substituted species which did not desorb in the regions 1202 remain on the surface and do not react with the surface conversion reactant. Then at FIG. 12E, the surface converted species in the region 1200 undergo the ligand exchange reaction to form ligand-substituted species in the region 1200, and again receives the targeted thermal/photon energy. The targeted thermal/photon energy further moves the ligand-substituted species in the region 1200, while not removing species in the region 1202, yield further selective etching of the region 1200, as shown at FIG. 12F.

Thus, through the application of targeted thermal or photon energy, a selective etch can be achieved using the ALE techniques of the present disclosure. It will be appreciated that in various implementations, the thermal/photon energy can be specifically directed using techniques known in the art. For example, techniques for directing photon energy used in the field of photolithography (e.g. lamp/laser light source, projected directly (maskless) or through a photomask) can be applied to direct photon energy to specific locations for desorption in the ALE process. It will be appreciated that the locations to which the thermal/photon energy is directed define a pattern for selective etching via ALE.

As noted above, ALE can be performed in both temporal and spatial systems. For temporal processes, the individual reactions are separated by time, requiring the use of effective purging between reactions, which is similar to temporal ALD. In a typical temporal process, the wafer is stationary at a station, and the operations are separated by time (by purges).

However, in spatial processes, the reactions are separated by space. For example, a reaction A is performed at location A, which is adjacent to a gas/vacuum curtain, which is adjacent to a location B at which a reaction B is performed, which is in turn adjacent to another gas/vacuum curtain. Spatial ALE can be performed using a carousel or linear track architecture. Thus, all reactions are occurring simultaneously at different locations. In a linear tool the process zones are always on, and the wafer is moved into and out of those zones. This is as opposed to multi-station sequential architecture, where wafers are stationary and run independent processes at each of the stations, and then the wafers are rotated from station to station. Such a multi-station system can be characterized as temporal in that the operations are separated by time, yet the process zones are also spatially separated within the system.

Figure 13:
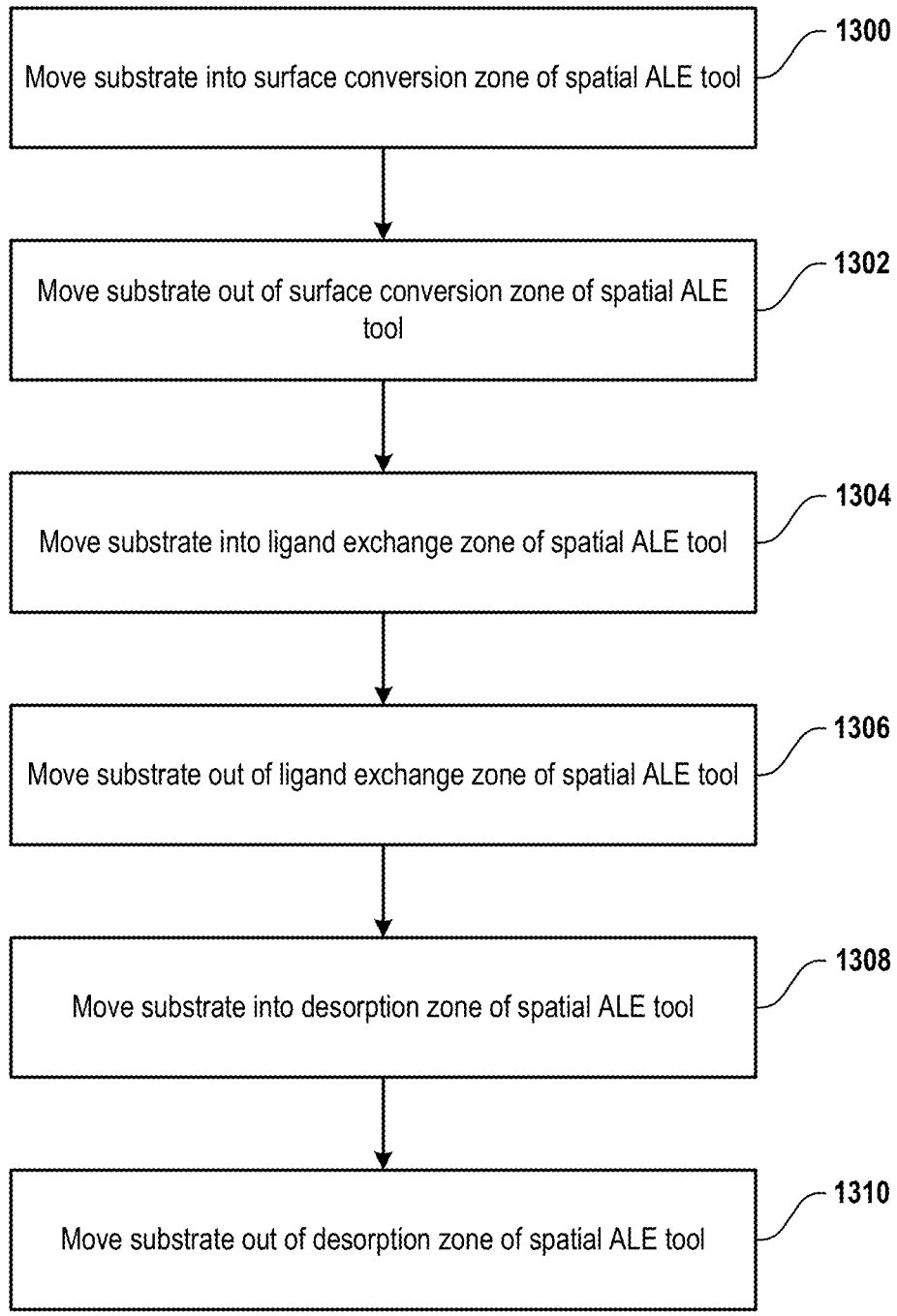
FIG. 13 illustrates a method for performing ALE of a substrate in a spatial ALE system, in accordance with implementations of the disclosure.

FIG. 13 illustrates a method for performing ALE of a substrate in a spatial ALE system, in accordance with implementations of the disclosure. At method operation 1300, a substrate is moved into a surface conversion zone of a spatial ALE tool, in which the substrate surface is exposed to a surface conversion reactant to effect the surface conversion reaction. At method operation 1302, the substrate is moved out of the surface conversion zone of the spatial ALE tool, through a purge zone of the spatial ALE tool.

At method operation 1304, the substrate is moved into a ligand exchange zone of the spatial ALE tool, in which the substrate surface is exposed to a ligand-containing reactant to effect the ligand exchange reaction. At method operation 1306, the substrate is moved out of the ligand exchange zone of the spatial ALE tool, through a purge zone of the spatial ALE tool.

At method operation 1308, the substrate is moved into a desorption zone of the spatial ALE tool, which is configured to effect desorption of the reaction product (ligand-substituted surface species) from the ligand exchange reaction. At method operation 1310, the substrate is moved out of the desorption zone of the spatial ALE tool, into a purge zone of the spatial ALE tool, to ensure complete removal of desorbed species from the substrate surface.

An issue in ALE processing is how to optimize dose times and determine when the desired amount of etching has been completed. In some implementations, a dose characterization can be performed. That is, a series of ALE process cycles are performed, and the amount of material removed is measured. Then it is possible to calculate an etch amount per cycle and determine etch rate as a function of dose time. In this way, it is possible to optimize dose time for the ALE process, and the number of cycles for a given etch operation can be tuned to achieve a desired etch amount.

In some implementations, desorption is monitored by an in situ infrared spectroscopy or effluent spectroscopy. This can be performed using techniques similar to those used for performing endpoint detection during a clean process. In some implementations, an IR detector is tuned to detect a characteristic stretch of a desorbed reaction product. This signal is monitored, and when the signal diminishes to or below a predefined threshold, then desorption is complete. For example, if an ALE process entailed desorption of $SiF_4$, then an IR detector could be tuned to detect the SiF stretch and monitor that signal (similar to a plasma clean for a deposition chamber). Thus, provided there is a spectral band capable of being monitored as an indicator, then it is possible to use in situ detection to determine when etching is complete.

Figure 14:
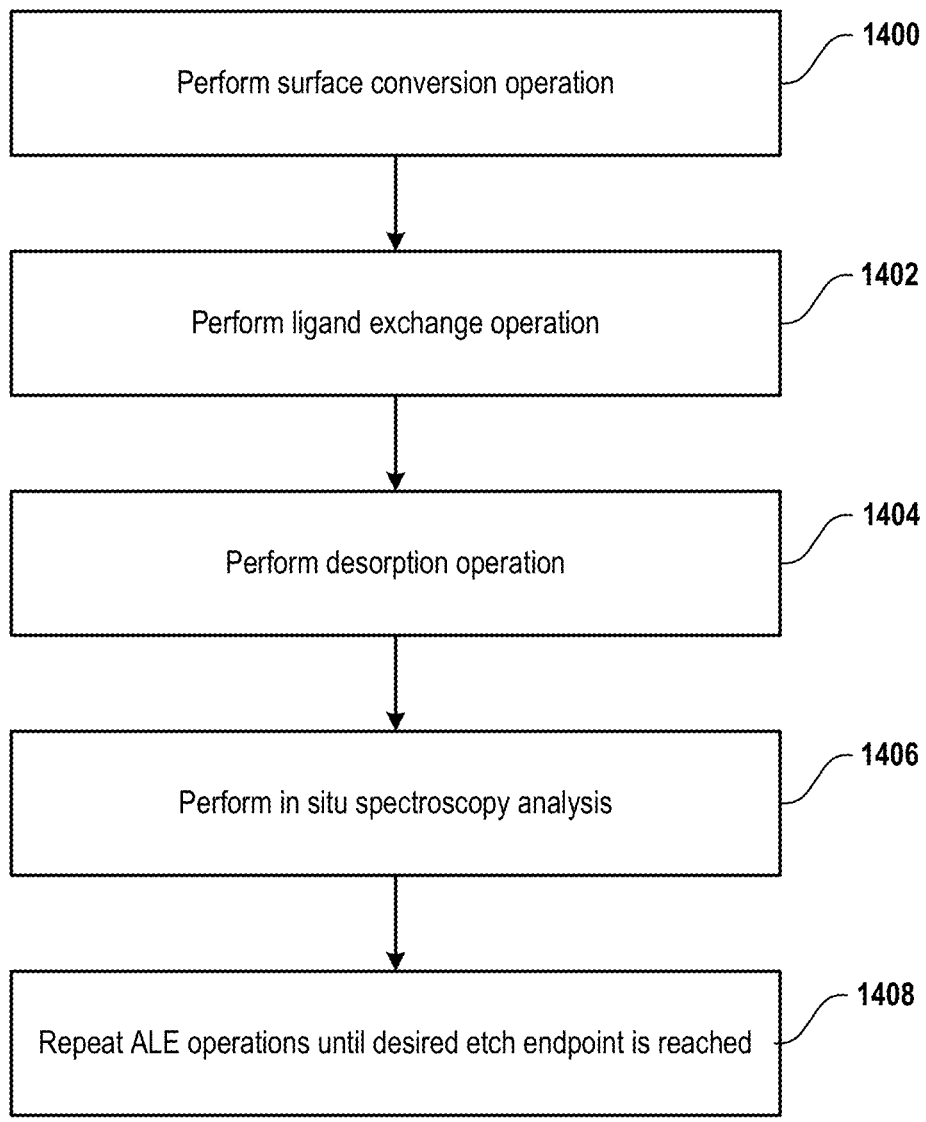
FIG. 14 illustrates a method for performing ALE processing with in situ spectroscopic analysis, in accordance with implementations of the disclosure.

FIG. 14 illustrates a method for performing ALE processing with in situ spectroscopic analysis, in accordance with implementations of the disclosure. At method operation 1400 a surface conversion operation is performed on the substrate. At method operation 1402, a ligand exchange operation is performed on the substrate. At method operation 1404, a desorption operation is performed on the substrate. At method operation 1406, in situ spectroscopy analysis is performed. For example, in some implementations, an emission corresponding to a desorbed species can be monitored from the desorption operation, to determine when desorption is complete. In some implementations, an emission corresponding to an interface endpoint can be monitored to determine whether the interface endpoint has been reached, which may serve as a signal to stop further ALE processing. At method operation 1408, the ALE operations (1400, 1402, 1404, and 1406) are repeated until a desired etch endpoint is reached, or until a predefined number of cycles is reached.

In some implementations, to characterize an ALE process, a quartz crystal microbalance can be used to measure weight in situ. This enables determination of weight loss of a thin film as a function of dose. Broadly speaking, the technique entails deposition of a thin film on a quartz crystal, which allows measurement of nanograms or femtograms of loss. By way of example, consider an ALE process on an aluminum oxide (AlOx) film. The formation of AlF and loss of weight associated with $SnAc_2$ or TMA ligand exchange and desorption from the aluminum fluoride film can be measured. These processes are self limiting in that only the surface of the AlOx is converted to AlF because there is no diffusion of F into the AlOx, and the ligand exchange only consumes that amount of AlF that's formed on the surface and volatilizes the Al compound that's formed with the tin compound that's formed. Thus, the ALE cycle stops when the ligand exchange and desorption are complete through self limiting mechanisms. It is then possible to measure weight change to characterize the ALE process and determine its effect, specifically the mass/amount of the AlOx that has been etched.

While a quartz crystal microbalance enables extremely precise measurement of weight changes to characterize ALE processes, it does not provide for measurement on a production wafer. Thus, in some implementations, ALE system hardware can include an integrated scale or mass comparator for purposes of measuring weight loss resulting from performance of an ALE process. In some implementations, a scale can be integrated into a loadlock to enable measurement of the weight of a wafer/substrate before and after ALE processing.

Figure 15:
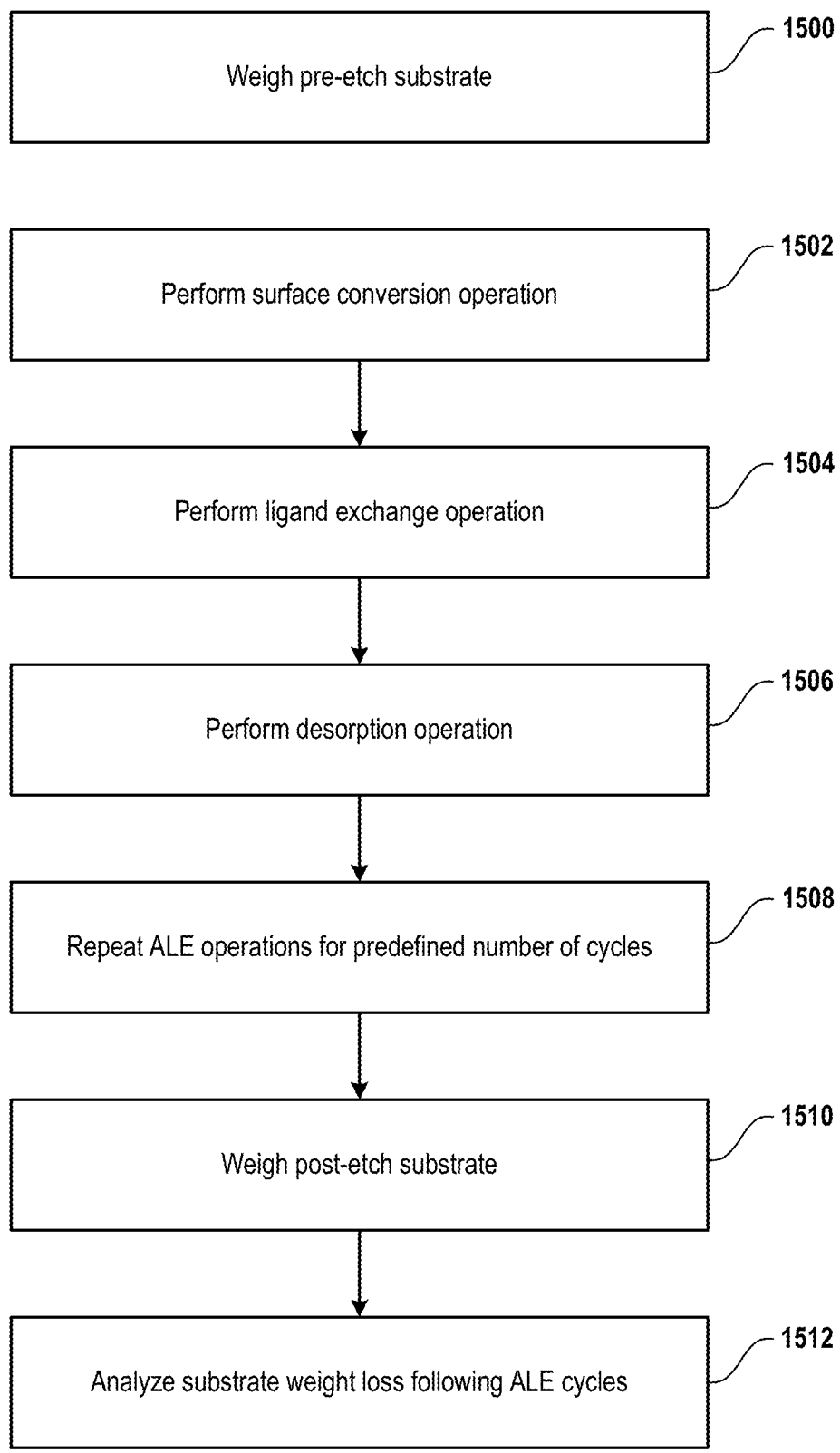
FIG. 15 illustrates a method for measuring etch of a substrate using weight, in accordance with implementations of the disclosure.

FIG. 15 illustrates a method for measuring etch of a substrate using weight, in accordance with implementations of the disclosure. At method operation 1500, a substrate is measured prior to performance of ALE processing. At method operation 1502 a surface conversion operation is performed on the substrate. At method operation 1504, a ligand exchange operation is performed on the substrate. At method operation 1506, a desorption operation is performed on the substrate. At method operation 1508, the ALE operations (1502, 1504, and 1506) are repeated for a predefined number of cycles.

At method operation 1510, following completion of the ALE process cycles, the post-etch substrate is weighed. At method operation 1512, the weight loss of the substrate (difference between pre-etch and post-etch substrate weights) is analyzed. For example, it may be determined whether an intended amount of material has been etched, or whether more or less than the intended amount of material has been etched. It will be appreciated that the measurement capability of the integrated scale may not enable monolayer resolution, and therefore, a series of ALE cycles is performed (for example, to remove on the order of tens of nanometers of film) before a post-etch weight measurement is determined.

It will be appreciated that out-of-chamber metrology analysis can be performed on an etched wafer/substrate, such as weight analysis and/or spectral ellipsometry.

In various implementations, systems of the present disclosure for performing ALE, such as those described with reference to FIGS. 3-6, can include a variety of features.

In some implementations, systems employ a closed or virtual sealed small volume chamber that enables rapid pressurization for the conversion step and the ligand exchange reaction, and rapid purging/pressure cycling.

For fluoride based ALE processes, systems do not require ceramic components as corrosion is generally not a problem. However, for processes using I, Br, or Cl, a ceramic system may be required due to the potential for etching of aluminum hardware.

A quad architecture (e.g. as employed in the Vector® systems manufactured by Lam Research Corporation) enables isolation of individual stations, simultaneous processing for throughput enhancement, with individual steps at individual stations. Stations can act as four small chambers within a larger chamber, with a virtual seal that enables pressurization in the reaction zone itself. This allows for pressurization during conversion step, and also allows rapid depressurization and purging.

Reagent/precursor delivery can be provided using a standard gas box, (multiple and simultaneous) liquid delivery, and/or (multiple and simultaneous) solid delivery. Rapid valve switching and rapid plasma switching is useful for providing accurate dosing and minimizing transition time between reaction/purge processes In some implementations, ultra small volume dual plenum shower heads are employed to handle multiple reagents and provide ultra-fast purging.

A point of use valve system can provide for isolation and fast switching. Point of use valve manifolds can be disposed directly on top of the showerhead.

In some implementations, biased susceptors are provided to promote anisotropic removal.

Figure 16:
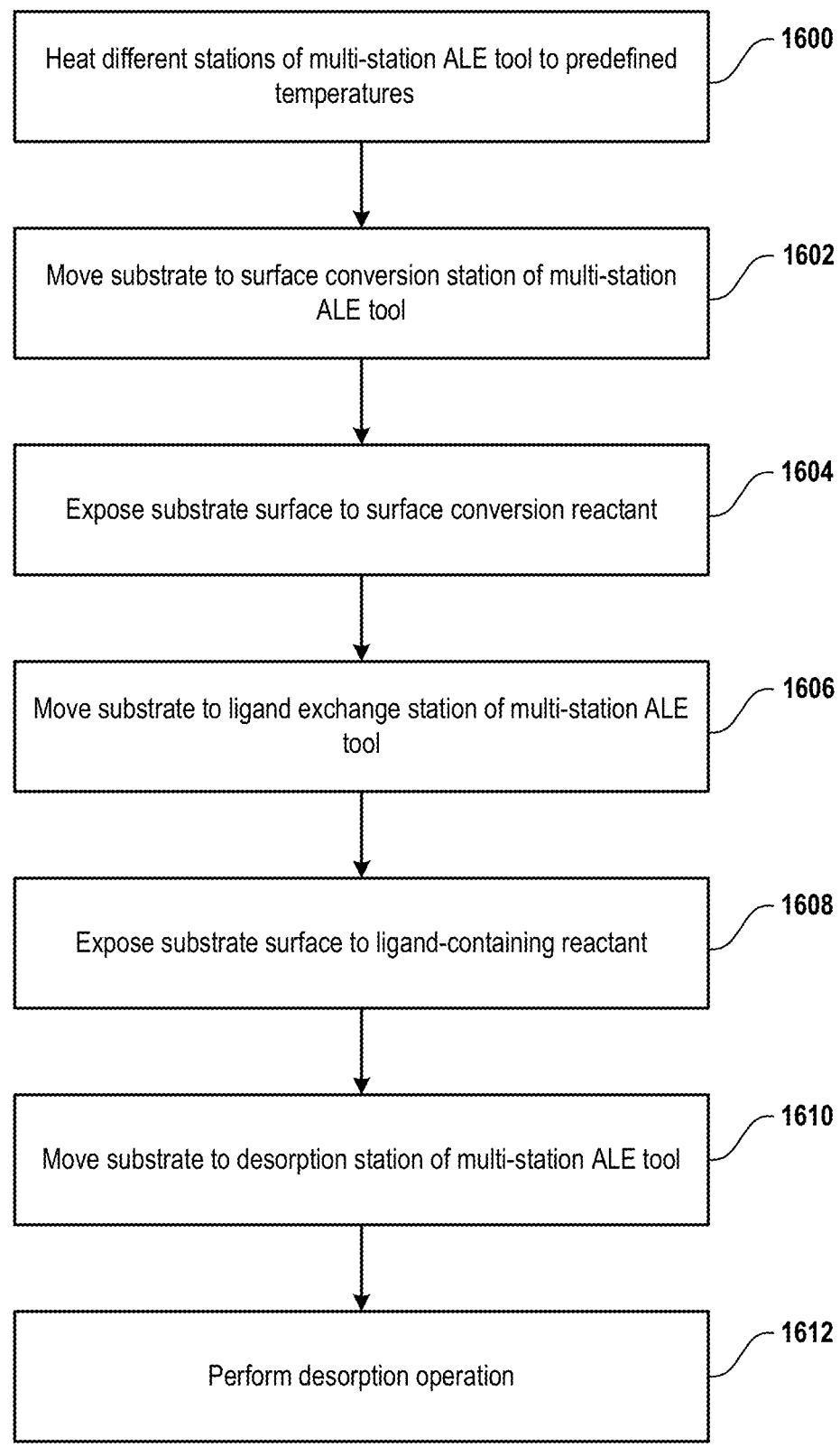
FIG. 16 illustrates a method for performing ALE of a substrate using a multi-station tool, in accordance with implementations of the disclosure.

FIG. 16 illustrates a method for performing ALE of a substrate using a multi-station tool, in accordance with implementations of the disclosure. At method operation 1600, the different stations of a multi-station ALE tool are prepared, including being heated to predefined temperatures specific to each station. At method operation 1602, a substrate is moved to a surface conversion station of the multi-station ALE tool. At method operation 1604, the substrate surface is exposed to a surface conversion reactant while positioned at the surface conversion station.

At method operation 1606, the substrate is moved to a ligand exchange station of the multi-station ALE tool. At method operation 1608, the substrate surface is exposed to a ligand-containing reactant while positioned at the ligand exchange station. In some implementations, desorption also occurs simultaneous with the ligand exchange reaction. However, in other implementations, desorption is performed at a different station.

Accordingly, at method operation 1610, the substrate is moved to a desorption station of the multi-station ALE tool. At method operation 1612, a desorption operation is performed on the substrate while positioned at the desorption station.

In some implementations, a dual pumping system is employed to control effluent pumping for non compatible effluents. Dry bed absorbers can be used to capture more problematic effluents (e.g. non-volatiles in exhaust). A dual pumping manifold can separate pumping of certain effluents into different pumps and abatement systems, to avoid salt formation in the exhaust lines.

Single or multi-station systems can have hardware and software that allows switching between different pump abatement units. For example, in some implementations, each station of a multi-station tool has a separate pumping manifold that comes to a single line. In some implementations, the single line can then split into two separate effluent lines, e.g. one for the surface conversion reaction effluents and one for the ligand exchange reaction effluents. For example, if dosing ammonia, effluents from the ammonia dosing step can be pumped through a first pump, and if in another step HCl is produced, then HCl can be pumped through a second pump. If both effluents were pumped through a single pumping manifold they would form ammonium chloride salt that would precipitate and clog the exhaust system. Thus in instances where the conversion and ligand exchange reactants may form salts, it is useful to have separate pump systems for each reactant, with one pumping system for the conversion operation and one pumping system for the ligand exchange operation.

This is useful for avoiding salt formation in instances such as when a halide and an amine are used for conversion and ligand exchange reactions. As another example, when using a chloride for conversion and TMA for ligand exchange, aluminum chloride can form, which is not very volatile and so will form a salt. Thus, in order to prevent salt formation, it is useful to have one pumping system for conversion and one pumping system for the ligand exchange reaction.

Figure 17:
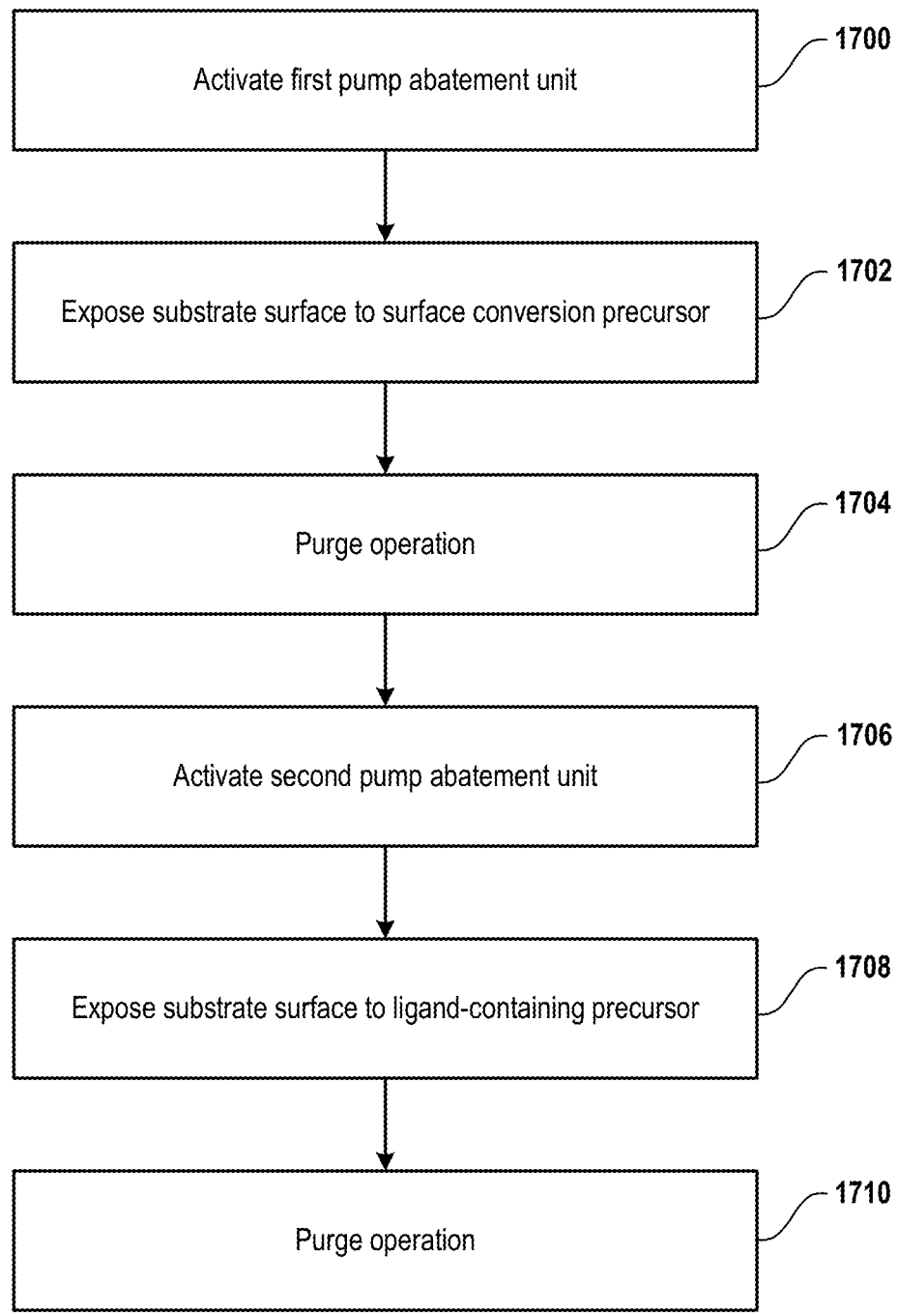
FIG. 17 illustrates a method for performing an ALE process, including using a dual pump abatement system, in accordance with implementations of the disclosure.

FIG. 17 illustrates a method for performing an ALE process, including using a dual pump abatement system, in accordance with implementations of the disclosure. At method operation 1700, a first pump abatement unit is activated, which is configured to pump effluents from the surface conversion reaction. At method operation 1702, the surface conversion reaction is performed, exposing the substrate surface to a surface conversion reactant. The effluents from the surface conversion process are pumped away through the first pump abatement unit. At method operation 1704, a purge operation is performed to ensure complete removal of reaction species, which are pumped through the first pump abatement unit.

At method operation 1706, a second pump abatement unit is activated (with the first pump abatement unit being deactivated), which is configured to pump effluents from the ligand exchange reaction. At method operation 1708, the ligand exchange reaction is performed, exposing the substrate surface to a ligand-containing reactant. The effluents from the ligand exchange process are pumped away through the second pump abatement unit. At method operation 1710, a purge operation is performed to completely remove any remaining reaction species from the ligand exchange reaction, which are pumped through the second pump abatement unit, thereby keeping them separate from those of the previous surface conversion reaction.

Following are example process conditions for ALE of MN in a Vector® platform (manufactured by Lam Research Corporation): (1) surface conversion reaction was effected by $NF_3$ exposure, specifically, RF based $NF_3$, Ar, HF=500 W, ~2 Torr, 350 C, time <5 s; (2) ligand exchange was effected by exposure to TMA at 350 C, 4 Torr process, 10% TMA in $N_2$.

Recently, tungsten hexafluoride ($WF_6$) etching of $TiO_2$ and $Al_2O_3$ films has been reported. Systems and methods of the present disclosure can be utilized for such processes.

Existing methods of performing ALE with Sn (tin) containing reactants can include a hydrogen plasma exposure to remove residual tin. However, in some implementations, instead of exposure to hydrogen plasma to remove residual tin, a desorption operation that is more gentle than plasma is employed, or which includes a limited dosage of plasma.

In some implementations, temperature control methods, which include use of heat lamps, laser heat emitters, and/or micro-mirror arrays, can direct heat to specific regions of the substrate to cause desorption in specific areas. In some implementations, micro-mirror arrays can be used to direct heat to specific areas of the wafer. In some embodiments, the micro-mirror array can be used to direct heat to very specific feature geometries, similar to lithography processes.

Methods for performing ALE include both temporal ALE methods and spatial ALE methods.

Figure 18:
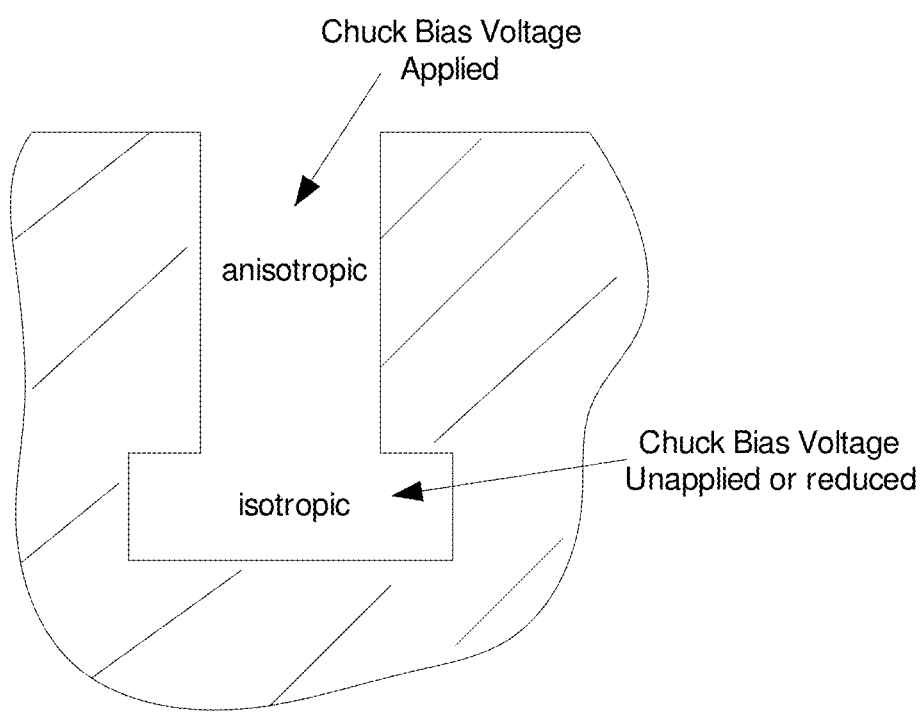
FIG. 18 illustrates anisotropic and isotropic etch being promoted via the application or de-application of bias power, in accordance with implementations of the disclosure.

In some implementations, ALE methods can include applying bias power to the chuck to promote anisotropic etching and removing bias power to promote isotropic etching. FIG. 18 illustrates anisotropic and isotropic etch being promoted via the application or de-application of bias power, in accordance with implementations of the disclosure. Furthermore, in some implementations, ALE methods can include controlling the bias power to enable transitioning between the two modes.

In some implementations, mixed compound (metals/organics) processing is desired where a wafer has different materials on the surface. There is a need for applying different treatments to achieve full removal. For example, this can include etching compound semiconductors, or alloys. In one example, it is possible to deliver two types of chemistries, to react with different types of materials. The delivery can be alternate or be simultaneous. In one example, the surface modification operation can be the same for both compounds, but the ligand-exchange and desorption operations can be different for each material.

In some implementations, ALE methods include using different pumps to handle different types of byproducts. This allows the system to remove the byproducts via different exhaust lines. The method can include detecting when one material is being removed, and then activating a first pump, and when the second material is being removed (or detected to be removed), a second pump can be activated. This method enables proper handling of byproducts.

In some implementations, methods include controlling etch selectivity of types of materials on the wafer. If the wafer has different materials that need etching, the system can use temperature control to enable selective etching of one material or another.

In some implementations, temperature control can be used to influence etching in certain wafer regions and influence deposition in other regions. In one example, the chuck can be controlled by including different temperature zones, which are addressable to identify where to heat more or less, so as to influence localized etch or deposition.

In various implementations, specific chemistries/processes are selected for specific materials to be etched.

In some implementations, systems include an adjustable temperature controlled chuck for influencing etch performance in specific regions of the wafer. Metrology systems may be integrated in a chamber to enable real-time, in situ measurement, and then temperature control. Chambers may have metrology for detecting the need to heat specific areas based on etch performance.

In some implementations, ALE systems include integrated metrology system for providing closed-loop monitoring of etch performance. The integrated metrology can be used, e.g., for determining whether the surface film has been etched to the desired thickness.

In some implementations, a dual pumping system is provided for evacuating plasma byproducts, depending on what is being etched.

Figure 19A:
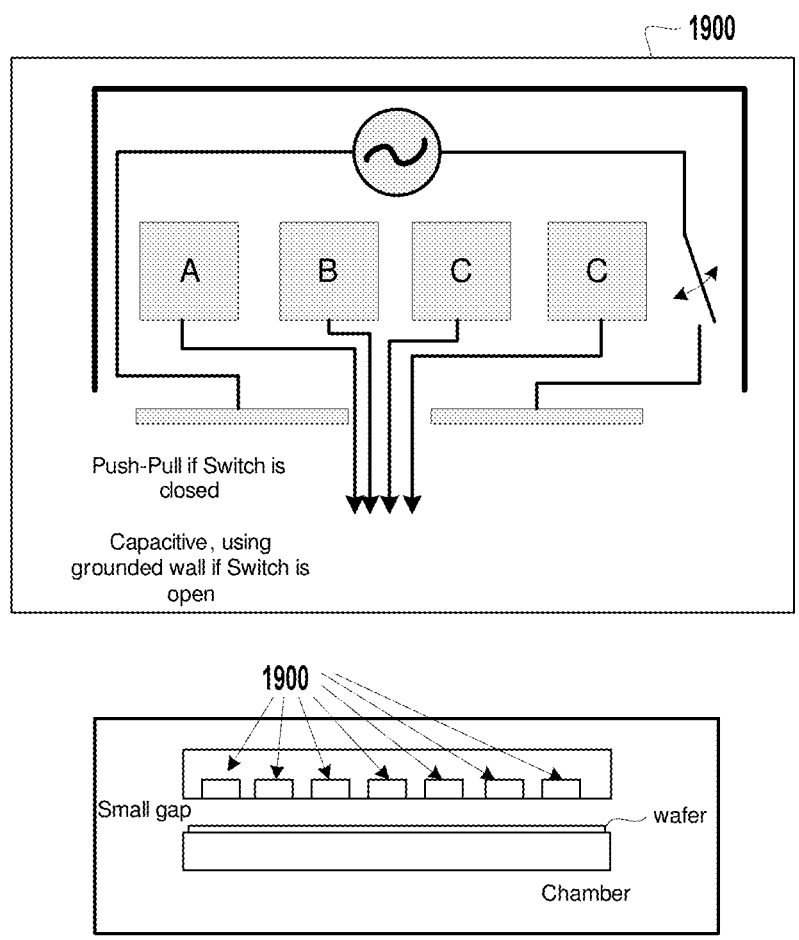
FIG. 19A illustrates a system having the aforementioned localized multi-gas delivery system 1900, in accordance with implementations of the disclosure.

In some implementations, a localized multi-gas delivery system is provided, which can be integrated in various zones over the wafer. This provides for fine control over different zones of the wafer, low power, fast switching, enables small chamber gap, without the need for an inductive plasma source. FIG. 19A illustrates a system having the aforementioned localized multi-gas delivery system 1900, in accordance with implementations of the disclosure.

In various implementations, ALE systems may use a single chamber, or multi-chamber systems. In multi-chamber systems, different processes can be carried out in different chambers.

In some implementations, a CCP chamber having the upper electrode connected to RF power is employed, and the chuck is held floating. In ALE processes, this configuration provides for reduced gaps close to 0.5 cm, and also provides for small plasma sheaths.

Figure 19B:
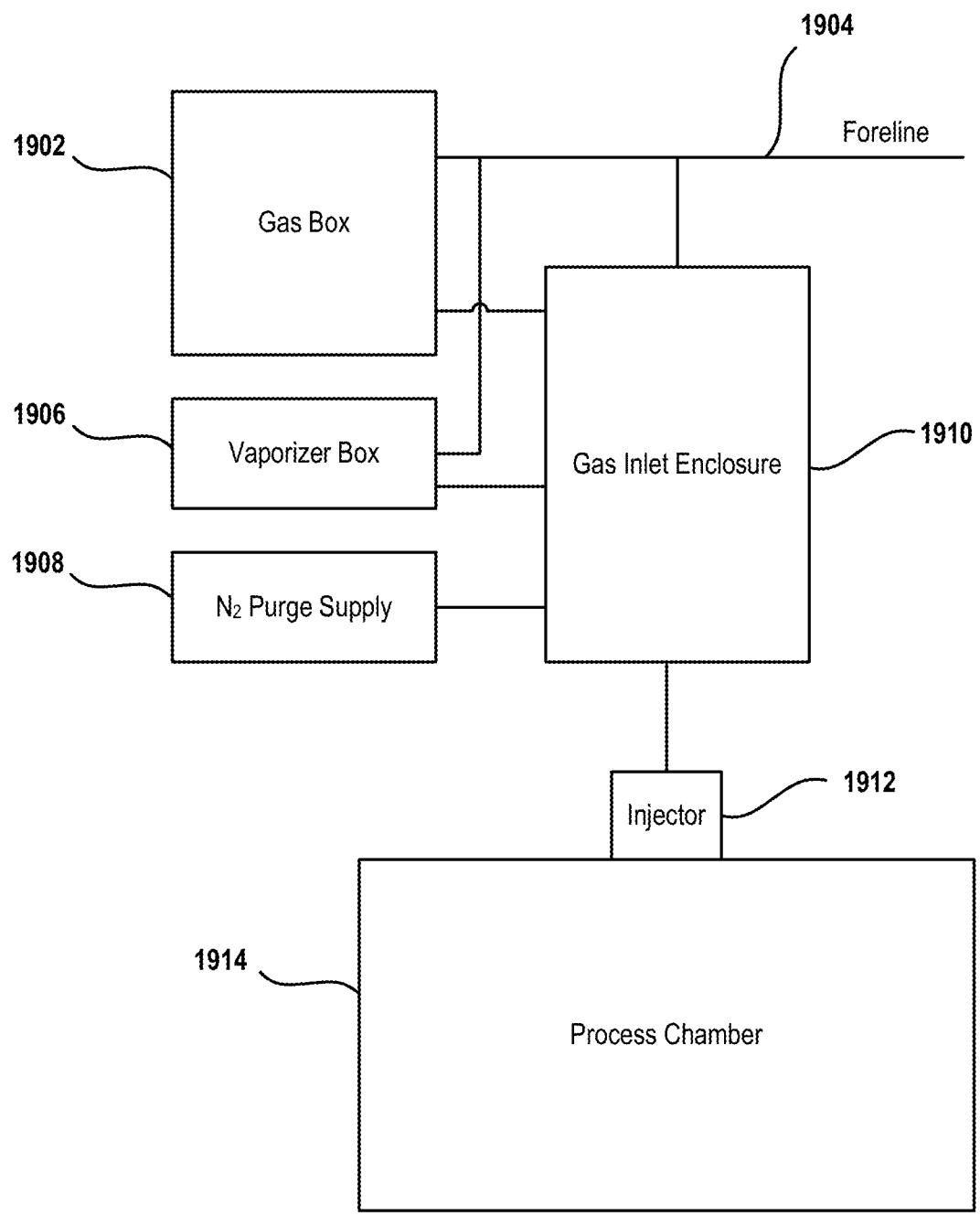
FIG. 19B conceptually illustrates a gas delivery system for delivering vapor reactants to a process chamber, in accordance with implementations of the disclosure.

In some implementations, systems for integrating special liquid delivery systems to the chamber are provided. FIG. 19B conceptually illustrates a gas/vapor delivery system for delivering vapor reactants to a process chamber, in accordance with implementations of the disclosure. In some implementations, the process chamber 1914 can be a process chamber such as that of the Kiyo® CX, manufactured by Lam Research Corporation. Broadly speaking, the provided gas/vapor delivery system is capable of delivering gas/vapor through injector nozzles 1912 into the process chamber 1914. A gas inlet enclosure 1910 includes gas/vapor lines and controllable valves to enable various flows of gas/vapor through the system. Gas/vapor that is routed through the gas inlet enclosure 1910 can be routed (by controlling the valves) to the injector nozzles 1912 to be injected into the process chamber 194, or to the foreline 1904 which is exhausted from the system.

As shown, the gas box 1902 connects to the gas inlet enclosure 1910, and also to the foreline 1904. The gas box 1902 can be configured to provide process gases to the gas inlet enclosure 1910 that are routed to the injector 1912 and into the process chamber.

A vaporizer box 1906 is configured to vaporize a liquid precursor and provide it to the gas inlet enclosure 1910. For example, the liquid precursor may be contained in an ampoule that is heated to promote vaporization. In some implementations, the vaporizer box 1906 can be configured to provide the vapor either with or without using a push gas (e.g. Ar). The vapor provided from the vaporizer box can be routed via the gas inlet enclosure 1910 to the injector 1912 or to the foreline 1904. In some implementations, the vaporizer box 1906 is also directly connected to the foreline 1904.

A purge supply 1908 provides an inert gas for purging (e.g. $N_2$) both the gas inlet enclosure 1910 as well as the process chamber 1914.

Figure 20:
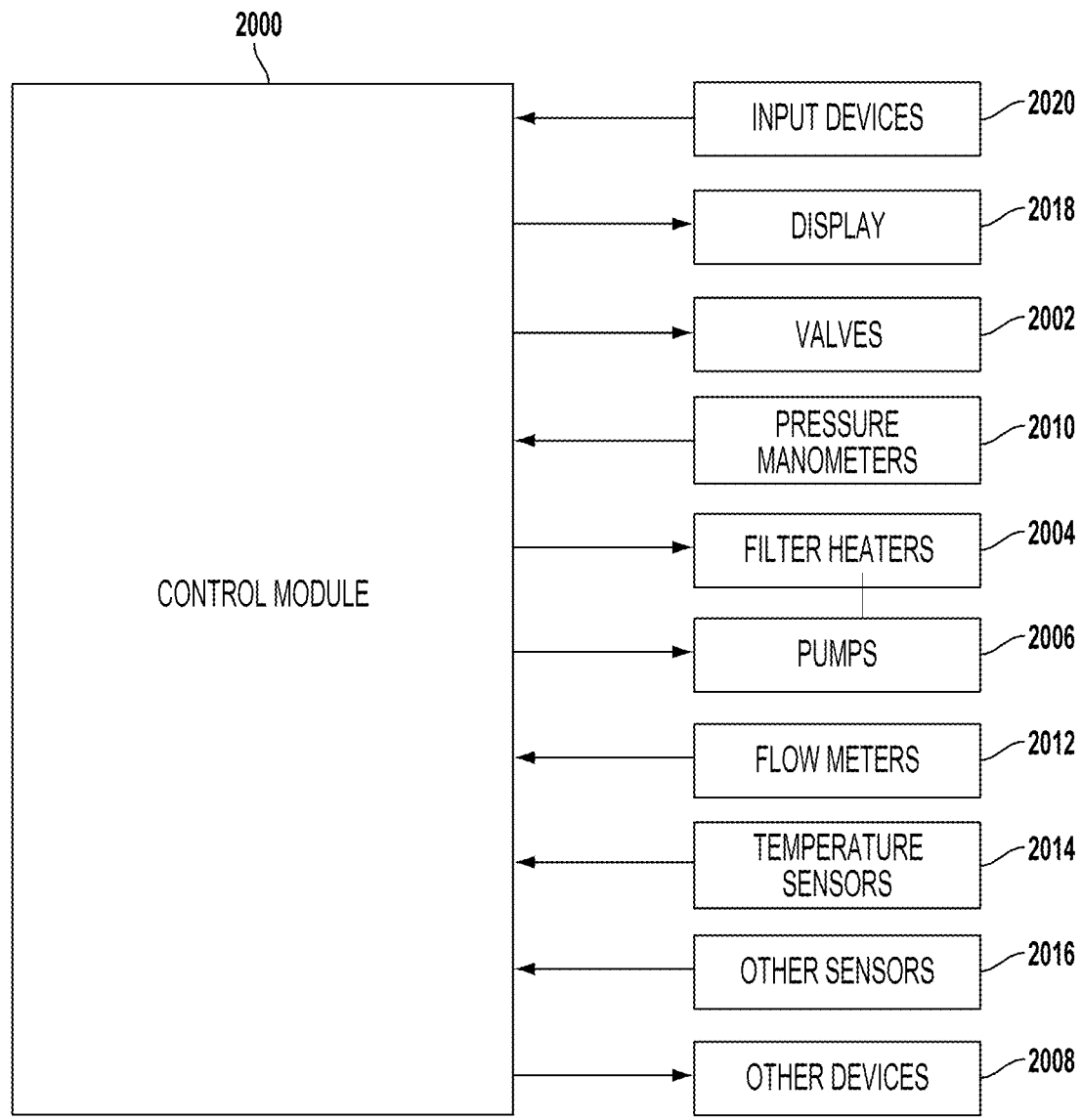
FIG. 20 shows a control module 2000 for controlling the systems of the present disclosure.

FIG. 20 shows a control module 2000 for controlling the systems described above. For instance, the control module 2000 may include a processor, memory and one or more interfaces. The control module 2000 may be employed to control devices in the system based in part on sensed values. For example only, the control module 2000 may control one or more of valves 2002, filter heaters 2004, pumps 2006, and other devices 2008 based on the sensed values and other control parameters. The control module 2000 receives the sensed values from, for example only, pressure manometers 2010, flow meters 2012, temperature sensors 2014, and/or other sensors 2016. The control module 2000 may also be employed to control process conditions during reactant delivery and plasma processing. The control module 2000 will typically include one or more memory devices and one or more processors.

The control module 2000 may control activities of the reactant delivery system and plasma processing apparatus. The control module 2000 executes computer programs including sets of instructions for controlling process timing, delivery system temperature, pressure differentials across the filters, valve positions, mixture of gases, chamber pressure, chamber temperature, wafer temperature, RF power levels, wafer ESC or pedestal position, and other parameters of a particular process. The control module 2000 may also monitor the pressure differential and automatically switch vapor reactant delivery from one or more paths to one or more other paths. Other computer programs stored on memory devices associated with the control module 2000 may be employed in some embodiments.

Typically there will be a user interface associated with the control module 2000. The user interface may include a display 2018 (e.g. a display screen and/or graphical software displays of the apparatus and/or process conditions), and user input devices 2020 such as pointing devices, keyboards, touch screens, microphones, etc.

Computer programs for controlling delivery of reactant, plasma processing and other processes in a process sequence can be written in any conventional computer readable programming language: for example, assembly language, C, C++, Pascal, Fortran or others. Compiled object code or script is executed by the processor to perform the tasks identified in the program.

The control module parameters relate to process conditions such as, for example, filter pressure differentials, process gas composition and flow rates, temperature, pressure, plasma conditions such as RF power levels and the low frequency RF frequency, cooling gas pressure, and chamber wall temperature.

The system software may be designed or configured in many different ways. For example, various chamber component subroutines or control objects may be written to control operation of the chamber components necessary to carry out the inventive deposition processes. Examples of programs or sections of programs for this purpose include substrate positioning code, process gas control code, pressure control code, heater control code, and plasma control code.

A substrate positioning program may include program code for controlling chamber components that are used to load the substrate onto a pedestal or ESC and to control the spacing between the substrate and other parts of the chamber such as a gas inlet and/or target. A process gas control program may include code for controlling gas composition and flow rates and optionally for flowing gas into the chamber prior to deposition in order to stabilize the pressure in the chamber. A filter monitoring program includes code comparing the measured differential(s) to predetermined value(s) and/or code for switching paths. A pressure control program may include code for controlling the pressure in the chamber by regulating, e.g., a throttle valve in the exhaust system of the chamber. A heater control program may include code for controlling the current to heating units for heating components in the reactant delivery system, the substrate and/or other portions of the system. Alternatively, the heater control program may control delivery of a heat transfer gas such as helium to the wafer ESC.

Examples of sensors that may be monitored during processing include, but are not limited to, mass flow control modules, pressure sensors such as the pressure manometers 2010, and thermocouples located in delivery system, the pedestal or ESC (e.g. the temperature sensors 2014). Appropriately programmed feedback and control algorithms may be used with data from these sensors to maintain desired process conditions. The foregoing describes implementation of embodiments of the disclosure in a single or multi-chamber semiconductor processing tool.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

Although the foregoing embodiments have been described in some detail for purposes of clarity of understanding, it will be apparent that certain changes and modifications can be practiced within the scope of the appended claims. Accordingly, the present embodiments are to be considered as illustrative and not restrictive, and the embodiments are not to be limited to the details given herein, but may be modified within their scope and equivalents of the claims.

What is claimed is:

1. A method for performing atomic layer etching of a surface of a substrate that is exposed for processing, comprising:
    performing a surface conversion operation by exposing an entirety of the surface of the substrate to a surface conversion reactant;
    performing a ligand exchange operation by exposing the entirety of the surface of the substrate to a ligand containing reactant;
    performing a desorption operation that effects removal of surface species from the surface of the substrate, wherein performing the desorption operation includes applying directed energy to targeted regions to define a pattern on the surface of the substrate, the targeted regions being less than the entirety of the surface that is exposed for processing, such that the targeted regions receive the applied energy whereas non-targeted regions of the surface of the substrate do not receive the applied energy;

performing a purge operation;

repeating the surface conversion operation, the ligand exchange operation, the desorption operation, and the purge operation, for a predefined number of cycles.

2. The method of claim 1, wherein performing the desorption operation includes applying thermal energy to the targeted regions of the substrate.

3. The method of claim 2, wherein the applying thermal energy to the substrate is performed after performing the ligand exchange operation.

4. The method of claim 2, wherein the applying thermal energy to the substrate is performed prior to and/or concurrently with the performing the ligand exchange operation.

5. The method of claim 2, wherein the applying thermal energy to the substrate includes activating a lamp to provide the thermal energy to the targeted regions of the surface of the substrate.

6. The method of claim 1, wherein performing the desorption operation includes exposing the surface of the substrate to a plasma.

7. The method of claim 6, wherein the exposing the surface of the substrate to a plasma includes applying a bias voltage to the substrate.

8. The method of claim 1, wherein performing the desorption operation includes exposing the targeted regions of the surface of the substrate to a photon source to effect photolytic desorption.

9. The method of claim 1,
wherein the surface conversion reactant adsorbs or chemisorbs on the surface of the substrate and modifies surface species on the surface of the substrate, wherein the surface conversion operation is substantially self-limiting;
wherein the ligand containing reactant reacts with the modified surface species to form ligand-substituted species that are desorbed from the surface of the substrate.

10. A method for performing atomic layer etching of a surface of a substrate that is exposed for processing, comprising:
performing a surface conversion operation by moving the substrate into a surface conversion zone of a spatial processing tool, the surface conversion zone configured to expose an entirety of the surface of the substrate to a surface conversion reactant;
performing a ligand exchange operation by moving the substrate into a ligand exchange zone of the spatial processing tool, the ligand exchange zone configured to expose the entirety of the surface of the substrate to a ligand containing reactant;
performing a desorption operation by moving the substrate into a desorption zone of the spatial processing tool, the desorption zone configured to effect removal of surface species from the surface of the substrate, wherein the desorption zone applies directed energy to targeted regions to define a pattern on the surface of the substrate, the targeted regions being less than the entirety of the surface that is exposed for processing, such that the targeted regions receive the applied energy whereas non-targeted regions of the surface of the substrate do not receive the applied energy;
repeating the surface conversion operation, the ligand exchange operation, and the desorption operation, for a predefined number of cycles.

11. The method of claim 10, wherein performing the desorption operation includes applying thermal energy to the targeted regions of the substrate.

12. The method of claim 11, wherein the applying thermal energy to the substrate includes activating a lamp to provide the thermal energy to the targeted regions of the surface of the substrate.

13. The method of claim 11, wherein performing the desorption operation includes exposing the surface of the substrate to a plasma.

14. The method of claim 10, wherein performing the desorption operation includes exposing the surface of the targeted regions of the substrate to a photon source to effect photolytic desorption.

15. The method of claim 10,
wherein the surface conversion reactant adsorbs or chemisorbs on the surface of the substrate and modifies surface species on the surface of the substrate, wherein the surface conversion operation is substantially self-limiting;
wherein the ligand containing reactant reacts with the modified surface species to form ligand-substituted species that are desorbed from the surface of the substrate.

16. The method of claim 10, further comprising:
after performing the surface conversion operation, performing a first purge by moving the substrate through a first purge zone of the spatial processing tool;
after performing the ligand exchange operation, performing a second purge by moving the substrate through a second purge zone of the spatial processing tool;
after performing the desorption operation, performing a third purge by moving the substrate through a third purge zone of the spatial processing tool;
wherein each of the predefined number of cycles further includes the first, second, and third purges.

* * * * *